United States Patent
Khazeni et al.

(10) Patent No.: US 10,322,398 B1
(45) Date of Patent: Jun. 18, 2019

(54) SYNTHESIS OF ZN(NH3) (CO3) INORGANIC HELICAL FRAMEWORK AND ITS USE FOR SELECTIVE SEPARATION OF CARBON DIOXIDE

(71) Applicant: Arrowhead Center, Inc., Las Cruces, NM (US)

(72) Inventors: Nasser Khazeni, Las Cruces, NM (US); Abbas Ghassemi, Las Cruces, NM (US)

(73) Assignee: Arrowhead Center, Inc., Las Cruces, NM (US)

( * ) Notice: Subject to any disclaimer, the term of this patent is extended or adjusted under 35 U.S.C. 154(b) by 15 days.

(21) Appl. No.: 15/268,460

(22) Filed: Sep. 16, 2016

Related U.S. Application Data

(60) Provisional application No. 62/219,565, filed on Sep. 16, 2015.

(51) Int. Cl.
| | |
|---|---|
| B01J 20/02 | (2006.01) |
| C01G 9/00 | (2006.01) |
| B01J 20/30 | (2006.01) |
| C01B 13/02 | (2006.01) |
| C01B 21/04 | (2006.01) |
| C07C 7/12 | (2006.01) |
| C30B 7/10 | (2006.01) |
| C30B 7/14 | (2006.01) |
| C30B 29/22 | (2006.01) |

(52) U.S. Cl.
CPC ....... *B01J 20/0277* (2013.01); *B01J 20/0244* (2013.01); *B01J 20/3085* (2013.01); *C01B 13/0262* (2013.01); *C01B 21/0455* (2013.01); *C01G 9/006* (2013.01); *C07C 7/12* (2013.01); *C30B 7/10* (2013.01); *C30B 7/14* (2013.01); *C30B 29/22* (2013.01); *C01B 2210/0015* (2013.01)

(58) Field of Classification Search
None
See application file for complete search history.

(56) References Cited

U.S. PATENT DOCUMENTS

| | | | |
|---|---|---|---|
| 2,695,843 A | 11/1954 | Schaufelberger et al. | |
| 2,898,191 A | 8/1959 | Conn et al. | |
| 2,961,295 A | 11/1960 | Montgomery | |
| 4,128,619 A | 12/1978 | Robinson | |
| 4,339,370 A | 7/1982 | Parker | |
| 4,710,215 A * | 12/1987 | Kasai | B01D 9/0031 62/532 |
| 5,810,909 A | 9/1998 | Notaro et al. | |
| 6,555,075 B2 * | 4/2003 | Nip | C01G 9/00 423/105 |

(Continued)

OTHER PUBLICATIONS

"Cryogenic Carbon Capture TM", https://sesinnovation.com/technology/carbon_capture/, 2008.

(Continued)

*Primary Examiner* — Tam M Nguyen
(74) *Attorney, Agent, or Firm* — Peacock Law P.C.; Isaac Estrada; Deborah A. Peacock

(57) ABSTRACT

A novel one-pot solvothermal reaction based on urea hydrolysis to synthesize single crystals of the $Zn(NH_3)(CO_3)$ inorganic helical framework and its applications in selective $CO_2$ separation.

9 Claims, 31 Drawing Sheets

(56) References Cited

U.S. PATENT DOCUMENTS

2003/0152508 A1    8/2003  Nip

OTHER PUBLICATIONS

"Key large-scale CO2 capture and storage (CCS) projects", https://www.co2captureproject.org/ccs_in_action.html, 2015.
"Petra Nova", ww.nrg.com/generation/projects/petra-nova/, 2016.
"Post-Combustion CO2 Capture", https://www.netl.doe.gov/research/coal/carbon-capture/post-combustion, 2016.
"Pre-Combustion CO2 Capture", https://www.netl.doe.gov/research/coal/carbon-capture/pre-combustion, 2016.
Alberthesheep in Mathematics . . . , "Topological Crystallography in Stockholm", Blog post www.haggisthesheep.com/wordpress.com, Jun. 19, 2012.
An, et al., "High and Selective CO2, Uptake in a Cobalt Adeninate Metal-Organic Framework Exhibiting Pyrimidine- and Amino-Decorated Pores", Journal of The American Chemical Society; vol. 132, 2010, 38-39.
Bae, et al., "Carborane-based metal-organic frameworks as highly selective sorbents for CO2 over methane", Journal of The Royal Society of Chemistry, 2008, 4135-4137.
Bae, et al., "Development and Evaluation of Porous Materials for Carbon Dioxide Separation and Capture", Angewandte Chem. Int. Ed..; vol. 50, 2011, 11586-11596.
Bae, et al., "Enhancement of CO2/CH4 selectivity in metal-organic frameworks containing lithium cations", Microporous and Mesoporous Materials; vol. 141, 2011, 231-235.
Banerjee, et al., "Control of Pore Size and Functionality in Isoreticular Zeolitic Imidazolate Frameworks and their Carbon Dioxide Selective Capture Properties", Journal of The American Chemical Society; vol. 131, 2009, 3875-3877.
Banerjee, et al., "High-Throughput Synthesis of Zeolitic Imidazolate Frameworks and Application to CO2 Capture", Science, vol. 319, Feb. 15, 2008, 939-943.
Bastin, et al., "A Microporous Metal-Organic Framework for Separation of CO2/N2 and CO2/CH4 by Fixed-Bed Adsorption", The Journal of Physical Chemistry C, vol. 112, American Chemical Society, 2008, 1575-1581.
Besancon, et al., "Structure and Properties of Monoammine-Zinc Carbonate", Materials Research Bulletin, vol. 20, Pergamon Press Ltd., 1985, 1063-1067 (w/English abstract).
Bezuidenhout, et al., "Extreme Carbon Dioxide Sorption Hysteresis in Open-Channel Rigid Metal-Organic Frameworks", Angewandte Chem. Int. Ed.; vol. 54, 2015, 2079-2083.
Cavenati, et al., "Adsorption Equilibrium of Methane, Carbon Dioxide, and Nitrogen on Zeolite 13X at High Pressures", Journal of Chemical Engineering; vol. 49, Jun. 5, 2004, 1095-1101.
Chen, et al., "Zn(II)-Benzotriazolate Clusters Based Amide Functionalized Porous Coordination Polymers with High CO2 Adsoprtion Selectivity", Inorganic Chemistry; vol. 53, Aug. 13, 2014, 8842-8844.
Choi, et al., "Broadly Hysteretic H2 Adsorption in the Microporous Metal-Organic Framework Co (1.4 benzenedipyrazolate)", Journal of The American Chemical Society: vol. 130, 2008, 7848-7850.
Choi, et al., "Highly Selective CO2 Capture in Flexible 3D Coordination Polymer Networks", Angewendt Chem. Int. Ed.; vol. 48, 2009, 6865-6869.
Conn, et al., "Zinc Oxide Hyperfine: Preparation and Properties", Journal of the American Pharmaceutical Association, vol. 55, No. 5, May 1956, 311-313.
Couck, et al., "An Anime-Functionalized MIL-53 Metal-Organic Framework with Large Separation Power for CO2 and CH4", Journal of The American Chemical Society; vol. 131, 2009, 6326-6327.
Dietzel, et al., "Application of metal-organic frameworks with coordinatively unsaturated metal sites in storage and separation of methane and carbon dioxide", Journal of Materials Chemistry; vol. 19, Aug. 21, 2009, 7362-7370.
Du, et al., "Fine-Tuning Pore Size by Shifting Coordination Sites of Ligands and Surface Polarization of Metal-Organic Frameworks to Sharply Enhance the Selectivity for CO2", Journal of The American Chemical Society; vol. 135, 2013, 562-565.
Espinal, et al., "Time-Dependent Co2, Sorption Hysteresis in a One-Dimensional Microporous Octahedral Molecular Sieve", Journal of The American Chemical Society; vol. 134, 2012, 7944-7951.
Farha, et al., "Chemical reduction of a diimide based porous polymer for selective uptake of carbon dioxide versus methane", Journal of the Royal Society of Chemistry "Chem Commun", 2010, 1056-1058.
Furukawa, et al., "The Chemistry and Applications of Metal-Organic Frameworks", Science; vol. 341, Aug. 13, 2013, 974-986.
Gong, et al., "A Luminescent Microporous Metal-Organic Framework with Highly Selective CO2 Adsorption and Sensing of Nitro Explosives", Inorganic Chemistry; vol. 53, Aug. 29, 2014, 9457-9459.
Han, et al., "High-Throughput Screening of Metal-Organic Frameworks for CO2 Separation", ACS Combinatorial Science, vol. 14, American Chemical Society, Mar. 20, 2012, 263-267.
Hu, et al., "Combination of Optimization and Metalated-Ligand Exchange: An Effective Approach to Functionalize UiO-66(Zr) MOFs for CO2 Separation", Chemistry-A European Journal, vol. 21, Wiley-VCH Verlag GmbH & Co. KGaA, Weinheim, 2015, 17246-17255.
Huang, et al., "Effect of temperature on gas adsorption and separation in ZIF-8: a combined experimental and molecular simulation study", Chemical Engineering Science; vol. 66, 2011, 6297-6305.
Jadhav, et al., "Monoethanol Amine Modified Zeolite 13X for CO2 Adsorption at Different Temperatures", Energy & Fuels; vol. 21, Sep. 28, 2007, 3555-3559.
Khazeni, et al., "Synthesis of zirconium tungstate-zirconia core-sheet composite particles", Materials Research Bulletin, vol. 46, Elsevier, Ltd., 2011, 2025-2031.
Li, et al., "Design and synthesis of an exceptionally stable and highly porous metal-organic framework", Nature; vol. 402, Nov. 18, 1999, 276-279.
Li, et al., "Establishing Microporosity in Open Metal-Organic Frameworks: Gas Sorption Isotherms for Zn (BDC)", Journal of The American Chemical Society: vol. 120, Aug. 11, 1998, 8571-8572.
Li, et al., "Selective Gas Adsorption and Separation in Metal-Organic Frameworks", Chem Soc Rev; vol. 38, Mar. 26, 2009, 1477-1504.
Liang, et al., "CO2 Adsorption-Based Separation by Metal Organic Framework (Cu-BTC) versus Zeolite (13X)", Energy & Fuels; vol. 23, 2009, 2785-2789.
Llewellyn, et al., "High Uptakes of CO2 and CH4 in Mesoporous Metal-Organic Frameworks MIL-100 and MIL-101", Langmuir, American Chemical Society, 2008, 7245-7250.
Lu, et al., "A Robust Binary Supramolecular Organic Framework (SOF) with High CO2 Adsorption and Selectivity", Journal of The American Chemical Society; vol. 136, 2014, 12828-12831.
Lu, et al., "Sulfonate-Grafted Porous Polymer Networks for Preferential CO2 Adsorption at Low Pressure", Journal of The American Chemical Society; vol. 133, 2011, 18126-18129.
Mavis, et al., "Kinetics of Urea Decomposition in the Presence of Transition Metal Ion s: Ni2", Journal of American Ceramics Society, 2006, 471-477.
Mellot-Draznieks, et al., "Hybrid Organic-Inorganic Frameworks: Routes for Computational Design and Structure Prediction", Angew. Chem. Int. Ed., vol. 43, Wiley-VCH Verlag GmbH & Co., KGaA, Weinheim, 2004, 6290-6296.
Millward, et al., "Metal-Organic Frameworks with Exceptionally High Capacity for Storage of Carbon Dioxide at Room Temperature", Journal of The American Chemical Society; vol. 127, 2005, 17998-17999.
Nugent, et al., "Porous materials with optimal adsorption thermodynamics and kinetics for CO2 separation", Nature; vol. 495, Mar. 7, 2013, 80-84.
Park, et al., "Exceptional chemical and thermal stability of zeolitic imidazolate frameworks", PNAS; vol. 102 No. 27, Jul. 5, 2006, 10186-10191.

(56) References Cited

OTHER PUBLICATIONS

Phan, et al., "Synthesis, Structure, and Carbon Dioxide Capture Properties of Zeolitic Imidazolate Frameworks", Accounts of Chemical Research; vol. 43. No. 1, Jan. 2010, 58-67.
Ravikovitch, et al., "Diffusion-Controlled Hysteresis", Adsorption, vol. 11, Springer Science + Business Media, Inc., The Netherlands, 2005, 265-270.
Seo, et al., "Hysteretic Gas Sorption in a Microporous Metal-Organic Framework with Nonintersecting 3D Channels", European Journal of Inorganic Chemistry, 2009, 4946-4949.
Sircar, "Basic Research Needs for Design of Adsorptive Gas Separation Processes", Ind. Eng. Chem. Res. vol. 45, Feb. 3, 2006, 5435-5448.
Song, et al., "Investigation of Adsorption Hysteresis in Microporous Materials", Studies in Surface Science and Catalysis, vol. 154, Elsevier B.V., 2004, 1797-1803.
Trinh, et al., "Simulation of pore width and pore charge effects on selectivities of CO2 vs. H2 from a syngas-like mixture in carbon mesopores", Energy Procedia 64, 2015, 150-159.
Wang, et al., "Assembly of Two Flexible Metal-Organic Frameworks with Stepwise Gas Adsorption and Highly Selective CO2 Adsorption", Crystal Growth & Design, vol. 14, American Chemical Society, 2014, 2375-2380.
Wang, et al., "Colossal cages in zeolitic imidazolate frameworks as selective carbon dioxide reservoirs", Nature; vol. 453, May 8, 2008, 207-212.
Wang, et al., "Synthesis of zinc oxide nanoparticles with controlled morphology", Journal of Material Chemistry; vol. 9, Sep. 6, 1999, 2871-2878.
Warner, "The Kinetics of the Hydrolysis of Urea and of Arginine", The Department of Chemistry, New York University College of Medicine, New York, Sep. 13, 1941, 705-723.
Wen, et al., "Solvothermal Synthesis and Characterization of Zn(NH3)CO3, Single Crystal", MRS Proceedings, vol. 817, Materials Research Society, 2004, L6.14.1-L6.14.6.
Wilmer, et al., "Structure-property relationships of porous materials for carbon dioxide separation and capture", Energy & Environmental Science, vol. 5, The Royal Society of Chemistry, 2012, 9849-9856.
Yaghi, et al., "Reticular synthesis and the design of new materials", Nature, vol. 423, 2003, 705-714.
Yang, et al., "A partially interpenetrated metal-organic framework for selective hysteretic sorption of carbon dioxide", Mature Materials; vol. 11, Aug. 2012, 710-716.
Yazaydin, et al., "Enhanced CO2 Adsorption in Metal-Organic Frameworks via Occupation of Open-Metal Sites by Coordinated Water Molecules", Chem. Mater. vol. 21, 2009, 1425-1430.
Zhang, et al., "Dual-Functionalized Metal-Organic Frameworks Constructed from Hexatropic Ligand for Selective CO2 Adsorption", Inorganic Chemistry; vol. 54, Feb. 19, 2015, 2310-2314.

* cited by examiner

SYNTHESIS OF ZN(NH3) (CO3) INORGANIC HELICAL FRAMEWORK AND ITS USE FOR SELECTIVE SEPARATION OF CARBON DIOXIDE

CROSS-REFERENCE TO RELATED APPLICATIONS

This application claims priority to and the benefit of the filing of U.S. Provisional Patent Application Ser. No. 62/219,565, entitled "SYNTHESIS OF ZN(NH$_3$)(CO$_3$) INORGANIC HELICAL FRAMEWORK AND ITS USE FOR SELECTIVE SEPARATION OF CARBON DIOXIDE", filed on Sep. 16, 2015, and the specification and claims thereof are incorporated herein by reference.

STATEMENT REGARDING FEDERALLY SPONSORED RESEARCH OR DEVELOPMENT

This invention was made with government support under Contract No. N00014-10-1-0711 awarded by the Office of Naval Research (ONR). The government has certain rights in the invention.

BACKGROUND OF THE INVENTION

Field of the Invention (Technical Field)

The present invention relates generally to inorganic helical frameworks, their synthesis and use, and more particularly, to synthesis and use of amminezinc carbonate ("Zn(NH$_3$)(CO$_3$)") inorganic helical frameworks.

The environmental issues associated with CO$_2$ emissions have made carbon capture and storage (CCS) a major research area for materials scientists and engineers, and among the most promising materials for CCS are adsorbents, which are characterized by the two main characteristics of adsorption capacity and separation selectivity. However, despite the synthesis of materials with such high adsorption capacities, the separation of CO$_2$ from other gases remains an ongoing challenge. CO$_2$, in the gaseous streams of the natural gas, hydrogen production, and power generation industries, typically is mixed with other gases such as N$_2$, CH$_4$, H$_2$, and O$_2$. Therefore, effective adsorbents must have not only high adsorption capacities, but also high selectivity for CO$_2$, ideally at the operating conditions of the relevant CO$_2$ sources. For instance, the flue gas of power plants is released at ambient temperature and pressure, and is comprised mainly of N$_2$ and CO$_2$ at a ratio of 85:15.

Ammoniacal ammonium carbonate solution has been widely used in the leaching of metals like nickel, copper, cobalt, iron, silver, manganese, and zinc from ores. The leaching system is usually made by a reaction between metal ore and ammonium carbonate in ammonia solution. Alternatively, ammonium carbamate and urea in water can be used. Ammonium and carbonate ions are released at temperatures above 363 K as a result of hydrolysis to form the leachant. The leaching process is based on the selective dissolution of the target metal ion from a polymetallic mixture. Such an understanding allows the adoption of a set of extraction reaction parameters whose establishment results in the formation of a soluble target metal leachate from the ore without an impact to other metals, which are left in the residue.

When ammoniacal ammonium carbonate (Zn—NH$_3$—CO$_3^{2-}$ system) or ammonia solution (Zn—NH$_3$—H$_2$O system) is the leachant, zinc amine complex is the soluble leachate that is produced. In the Zn—NH$_3$—H$_2$O system, Zn(NH$_3$)$_4^{2+}$ is stable in the pH range of 8 to 11 when the total concentration of NH$_3$ is 1M. Outside of this pH range, the stable species is zinc hydroxide. Additionally, when the concentration of ammonia increases, the stability regions of the solid phase shrink and eventually disappear. The pH range at which zinc tetraammine complex is stable in the Zn—NH$_3$—CO$_3^{2-}$ system is approximately the same for the Zn—NH$_3$—H$_2$O system. The extraction reaction for zinc oxide in an ammonia-ammonium carbonate system is represented by Equation 1:

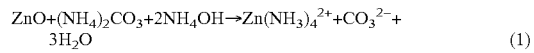
$$ZnO+(NH_4)_2CO_3+2NH_4OH \rightarrow Zn(NH_3)_4^{2+}+CO_3^{2-}+3H_2O \quad (1)$$

Although the product of Equation 1 gives a Zn:NH$_3$ ratio of 1:4, t this ratio may vary from 1:1 to 1:6, depending on the concentration of ammonia in the solution. Therefore, several compounds of Zn(NH$_3$)$_X$(CO$_3$) are possible. The compound where X=1, Zn(NH$_3$)(CO$_3$), is not soluble in water and precipitates. In the Zn—NH$_3$—CO$_3^{2-}$ system, this compound is a solid phase, as is the Zn$_5$(OH)$_6$(CO$_3$)$_2$ that forms at higher zinc concentrations.

Synthesis of Zn(NH$_3$)(CO$_3$) was first reported via a two-step procedure: production of Zn(NH$_3$)$_4$(CO$_3$) by reaction between zinc oxide or zinc carbonate and ammonium carbonate in ammonia solution and, then, precipitation of Zn(NH$_3$)(CO$_3$) by heating, air blowing, or saturating of Zn(NH$_3$)$_4$(CO$_3$) solution with CO$_2$ at high pressure in order to lower the ammonia content of the solution. Later, single crystal x ray diffraction analysis (SC-XRD) revealed the unit cell characters of the crystalline structure. Based on the analysis, the lattice had orthorhombic system with unit cell parameters of a=9.130 Å, b=5.498 Å, and c=7.593 Å and space group of Pna2$_1$ (ICSD #41113).

Embodiments of the present invention provide methods to synthesize Zn(NH$_3$)(CO$_3$) and its application in CCS.

BRIEF SUMMARY OF THE INVENTION

Embodiments of the present invention comprise a method of synthesizing Zn(NH3)(CO3) in a one-pot solvothermal reaction based on urea hydrolysis comprising: constructing a Zn—NH3-CO32- system comprising a zinc source and urea solutions in the mixture of N,N-Dimethylformamide (DMF) and water; heating at between approximately 80° C. and approximately 100° C.; solvothermal aging at between approximately 120° C. and approximately 160° C.; and growing single crystals of Zn(NH3)(CO3). In one embodiment the zinc source is selected from the group consisting of zinc acetate, zinc nitrate, zinc chloride, and zincsulfate. In one embodiment the heating is carried out for between approximately 1 hour and approximately 10 hours.

In one embodiment, the constructing a Zn—NH3-CO32- system a comprises dissolving the urea in the DMF and water; heating up at between approximately 85° C. and approximately 95° C. for between approximately 1 hr. and approximately 6 hrs.; adding zinc acetate solution is to hydrolyzed urea solution; and heating the resulting mixture up for between approximately 15 minutes to approximately 90 minutes until precipitation is completed. In one embodiment, the mixture of zinc acetate and urea is heated until precipitation is completed. In one embodiment, the solvothermal aging is carried out for between approximately 1 and approximately 7 days. In one embodiment, the growing single crystals step further comprises washing the crystals in with DMF and soaking the crystals in chloroform. Preferably, the Zn—NH3-CO32- system is maintained at the pH of between approximately 8 and approximately 11. Preferably, the Zn—NH3-CO32− system comprises concentrations of zinc and carbonate ions at about 0.1M. Preferably, the urea hydrolysis slowly pumps NH3 and Carbonate to the reaction medium.

In one embodiment DMF is substituted for another solvent with a high boiling point, for example, N-Methyl-2-pyrrolidone (NMP), dimethyl sulfoxide (DMSO), hexamethylphosphoramide (HMPA), pyridine (Py), and gamma-Butyrolactone (GBL).

Embodiments of the invention further comprise a method to capturing CO2 comprising: adsorption screening of CO2 from a gas mixture by Zn(NH3)(CO3). In one embodiment, the gas mixture is a CO2/O2 mixture. In one embodiment, the capture is for an oxy-fuel CO2 process by pressure swing adsorption and preferably the Pads/Pdes is about 5 atm/1 atm.

In a different embodiment, the gas mixture is CO2/CH4. In one embodiment, the capture is for landfill gas process under pressure swing adsorption, and the Pads/Pdes is preferably about 5 atm/1 atm.

In another embodiment, the capture is for landfill gas process under vacuum swing adsorption and preferably the Pads/Pdes is about 1 atm/0.1 atm.

Embodiments of the invention comprise a method of separating O2 from N2 in air comprising: adsorption screening of O2 in air by Zn(NH3)(CO3). In one embodiment, the Pads/Pdes is about 5 atm/1 atm.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Figure 1:
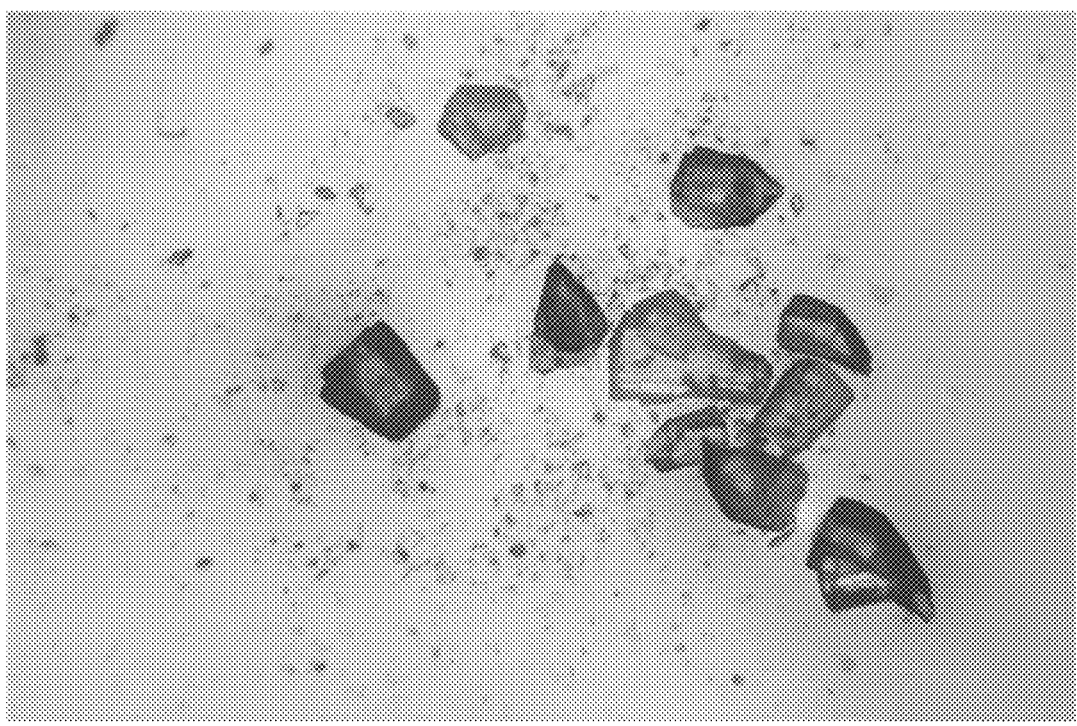
FIG. 1 is a photograph of $Zn(NH_3)(CO_3)$ single crystals.

In the following detailed description, numerous specific details are set forth in order to provide a thorough understanding of the embodiments of the invention. However, it will be understood by one of ordinary skill in the art that the embodiments may be practiced without these specific details. For instance, well known operation or techniques may not be shown in detail. Technical and scientific terms used in this description have the same meaning as commonly understood to one or ordinary skill in the art to which this subject matter belongs.

In one embodiment, Zn(NH$_3$)(CO$_3$) is synthesized through a single-pot approach based on urea hydrolysis and solvothermal aging. In this embodiment, zinc acetate and urea solutions in the mixture of N,N-Dimethylformamide (DMF) and water are preferably used to construct a Zn—NH$_3$—CO$_3^{2-}$ system that upon heating at between approximately 80° C. and approximately 100° C., more preferably between approximately 85° C. and approximately 95° C., and most preferably between approximately 88° C. and approximately 92° C., and afterwards solvothermal aging at between approximately 120° C. and approximately 160° C., more preferably between approximately 130° C. and approximately 150° C., and most preferably between approximately 135° C. and approximately 142° C., leads to the growth of large single crystals of Zn(NH$_3$)(CO$_3$). In one embodiment DMF is substituted for another solvent with a high boiling point, for example, N-Methyl-2-pyrrolidone (NMP), dimethyl sulfoxide (DMSO), hexamethylphosphoramide (HMPA), pyridine (Py), and gamma-Butyrolactone (GBL).

Thermodynamic calculations show that zinc ammine is the dominant stable specie in Zn—NH$_3$—CO$_3^{2-}$ system at pH of 10 when concentration of total zinc and carbonate ions are below 0.1M respectively. As the concentration of the zinc or carbonate ions increase, the zinc ammine fraction exponentially decreases and Zn$_5$(OH)$_6$(CO$_3$)$_2$ precipitates. Therefore, as long as synthesis of Zn(NH$_3$)(CO$_3$) is taking place, the concentration of zinc and carbonate sources in the reaction mixture should preferably not exceed about 0.1M.

In addition to the zinc and carbonate sources concentration, the concentration of ammonia in the reaction mixture is preferably low enough to control the pH between 8 and 11 to crystalize Zn(NH$_3$)(CO$_3$) rather than production of soluble zinc ammine complexes. For example, low introduction of ammonia to the reaction medium is optionally used to prevent production of soluble zinc ammine complexes, which is preferably achieved by a urea hydrolysis system. Upon heating above approximately 90° C., the aqueous solution of urea decomposes to cyanate and ammonium ions resulting in a series of acid/base reactions. The overall effect of those reactions is slow release of ammonia to the reaction medium:

$$OC(NH_2)_2 \rightleftharpoons NCO^- + NH_4^+ \quad (2)$$

$$NCO^- + 2H_2O \rightarrow NH_3 + HCO_3^- \quad (3)$$

The urea hydrolysis reactions and associated acid/base equilibria when the aqueous urea solution is heated at approximately 90° C. are as follows:

$$OC(NH_2)_2 \rightleftharpoons NCO^- + NH_4^+ \quad (4)$$

$$NCO^- + 2H_2O \rightarrow NH_3 + HCO_3^- \quad (5)$$

$$NCO^- + 2H_2O + HCO_3^- \rightarrow NH_3 + 2HCO_3^- \quad (6)$$

$$NCO^- + 2H_2O + NH_3 \rightarrow 2NH_3 + HCO_3^- \quad (7)$$

$$HNCO + H_2O + H^+ \rightarrow NH_4^+ + CO_2 \quad (8)$$

$$HNCO + H_2O \rightarrow NH_3 + CO_2 \quad (9)$$

$$H_2O \rightleftharpoons H^+ + OH^- \quad (10)$$

$$NH_4^+ \rightleftharpoons NH_3 + H^+ \quad (11)$$

$$CO_2 + H_2O \rightleftharpoons HCO_3^- + H^+ \quad (12)$$

$$HCO_3^- \rightleftharpoons CO_3^{-2} + H^+ \quad (13)$$

$$HNCO \rightleftharpoons NCO^- + H^+ \quad (14)$$

Reactions 4 to 9 are independent reactions of decomposition of the urea to ammonia and cyanate and later decomposition of cyanate to ammonia and carbonic acid. CO$_2$ in Equations 8 and 9 denotes gaseous and aqueous carbon dioxide and carbonic acid. Equations 10 to 14 are acid/base equilibria associated with the dissociations of urea products including cyanic acid, carbonic acid, and ammonium ion. The overall acid/base dissociation leads to a slow release of ammonia in the solution.

The products of the second reaction (equation 3) preferably supply the ammonia and carbonate to the Zn(NH$_3$)(CO$_3$) structure and the ammonium ion from the first reaction (equation 2) serves as buffer to maintain the pH in the range of 8 to 11. The overall reaction of crystal formation follows:

$$Zn^{2+} + OC(NH_2)_2 + 3H_2O \rightarrow Zn(NH_3)(C_3) + NH_4OH + 2H^+ \quad (15)$$

Another function of slow release of NH$_3$ to reaction medium is preferably balancing the nucleation vs. growth reactions of crystallization in favor of growth reaction that preferably leads to the formation of large single crystals.

INDUSTRIAL APPLICABILITY

The invention is further illustrated by the following non-limiting example.

Example 1

A mixture of 19 mL DMF and 1 mL water was prepared. 439.0 mg (0.2 mmol) zinc acetate and 132 mg (2.2 mmol) urea were gently mixed in 2×10 mL of the solvent mixture to dissolve. Then, zinc acetate solution was gradually added to the urea solution and gently mixed to make a uniform solution. The solution of reactants was then capped and heated to 90° C. The heating resulted in precipitation. The mixture was heated for 2 hr. Next, the reaction mixture was placed into the Teflon liner of a hydrothermal reactor and the mixture was heated at 140° C. for 4 days. The process led to the formation of large single crystals of the product that were washed with DMF and dispersed into 10 mL of fresh chloroform for 4 days. The chloroform was exchanged every day. Finally, the crystals were activated by heating at 110° C. under vacuum to be prepared for adsorption analysis.

Example 2

Urea (60 mg, 1 mmole) was dissolved in DMF (5 mL) in a 20-mL vial. Then, deionized water (1 mL) was slowly dripped into the urea solution in DMF and the vial was capped. The obtained solution was heated at 90-95° C. for 6 h. Afterwards, zinc acetate (329.3 mg, 1.5 mmole) was dissolved in DMF (10 mL) and dripped into the urea solution. The mixture started to precipitate, and it was heated at 90° C. for 1 h until precipitation was completed. Next, the uncapped vial of the mixture was placed into the Teflon liner of a hydrothermal reactor and heated at 150° C. for 4 days. Finally, the produced crystals were washed 3 times with DMF (10 mL) and then soaked in chloroform (10 mL) for 3 days. Every day, the used chloroform was replaced with a fresh solvent.

FIG. 1 is a photograph of $Zn(NH_3)(CO_3)$ single crystals.

Figure 2:
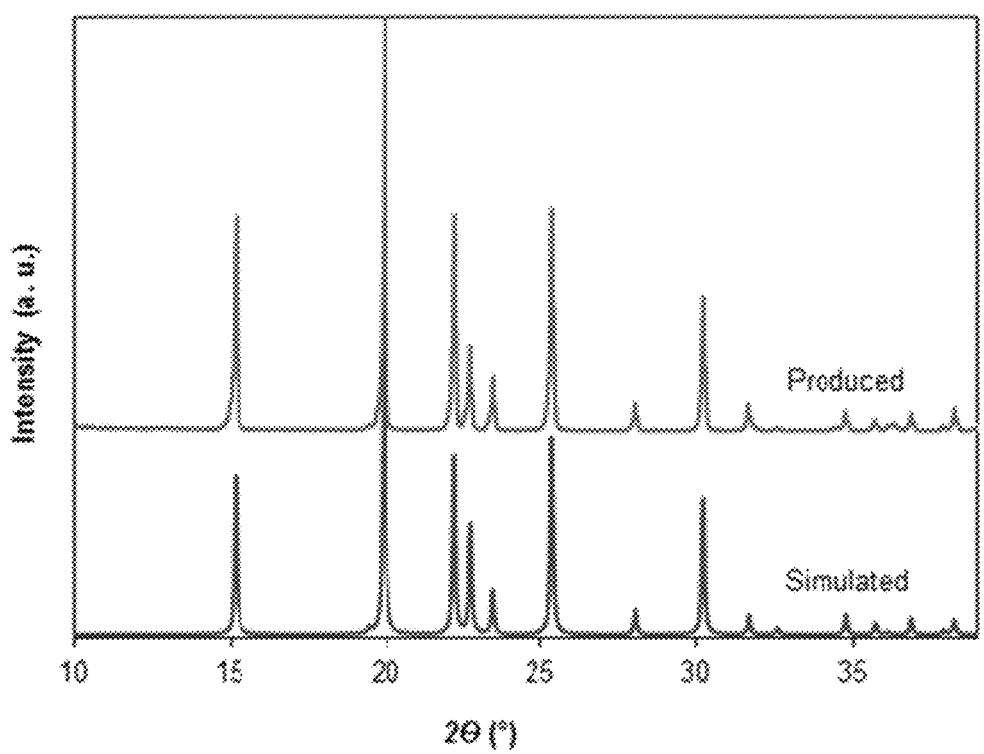
FIG. 2 shows powder x ray diffraction ("PXRD") pattern of as-synthesized product as well as simulated pattern of $Zn(NH_3)(CO_3)$.
Figure 3:
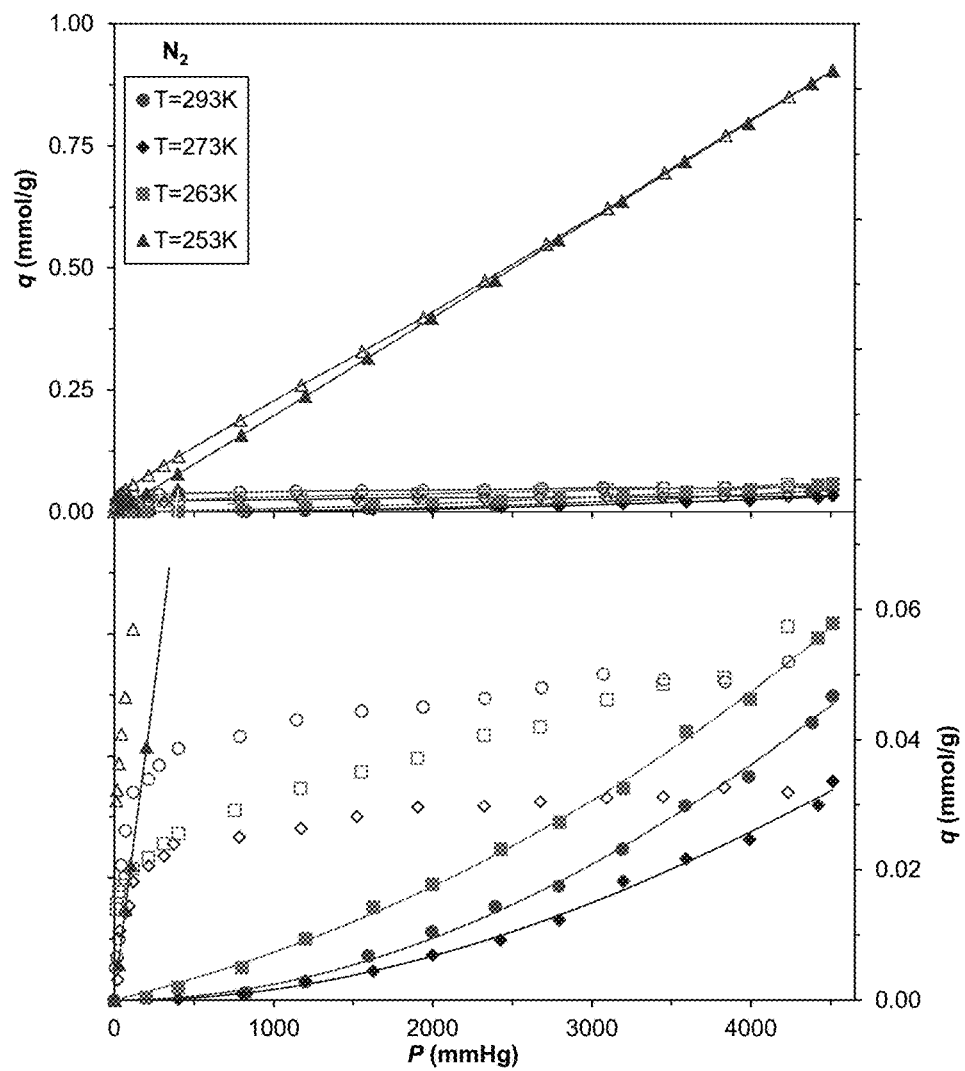
FIG. 3 shows adsorption isotherm for $N_2$ uptake at 293, 273, 263, and 253 K.
Figure 4:
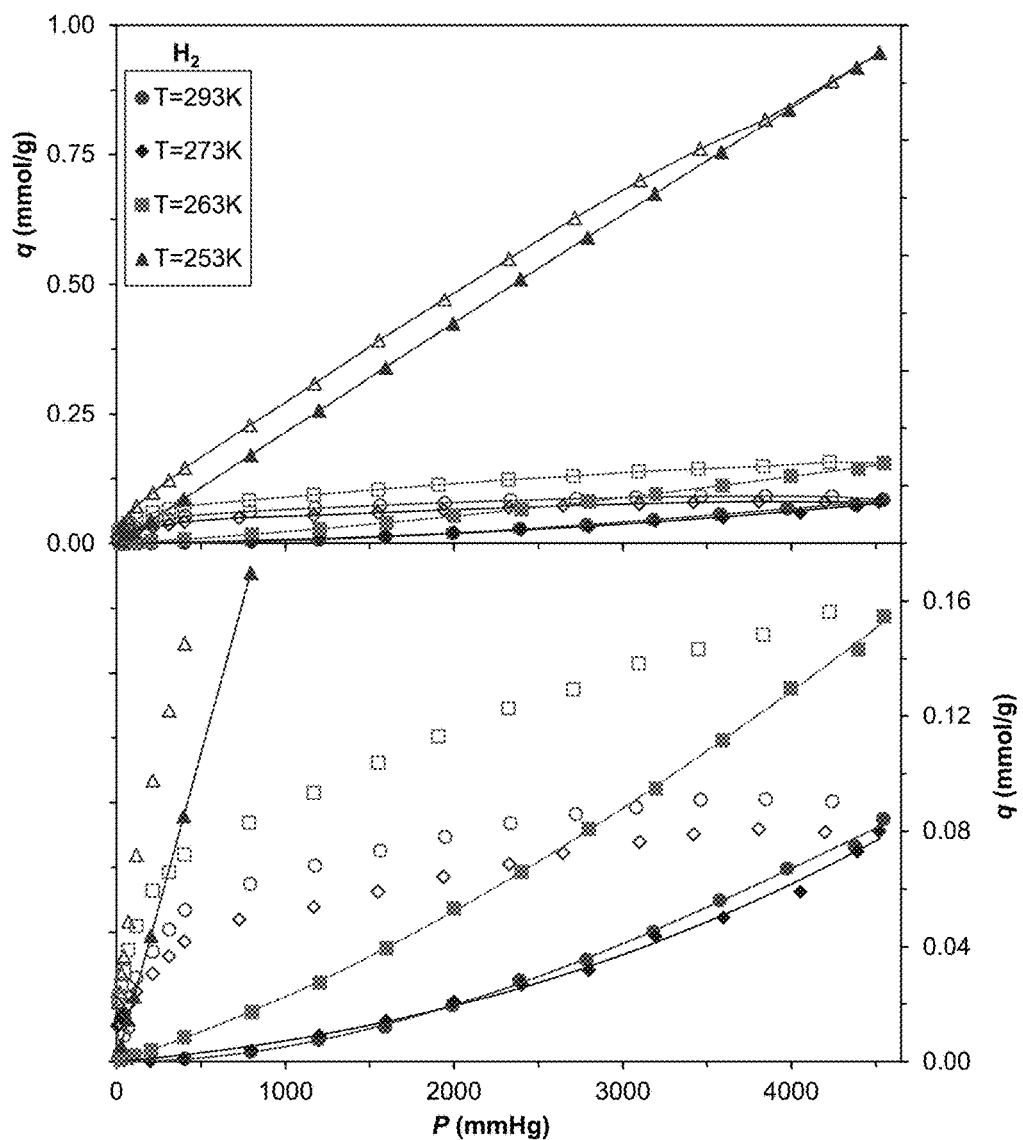
FIG. 4 shows adsorption isotherm for $H_2$ uptake at 293, 273, 263, and 253 K.
Figure 5:
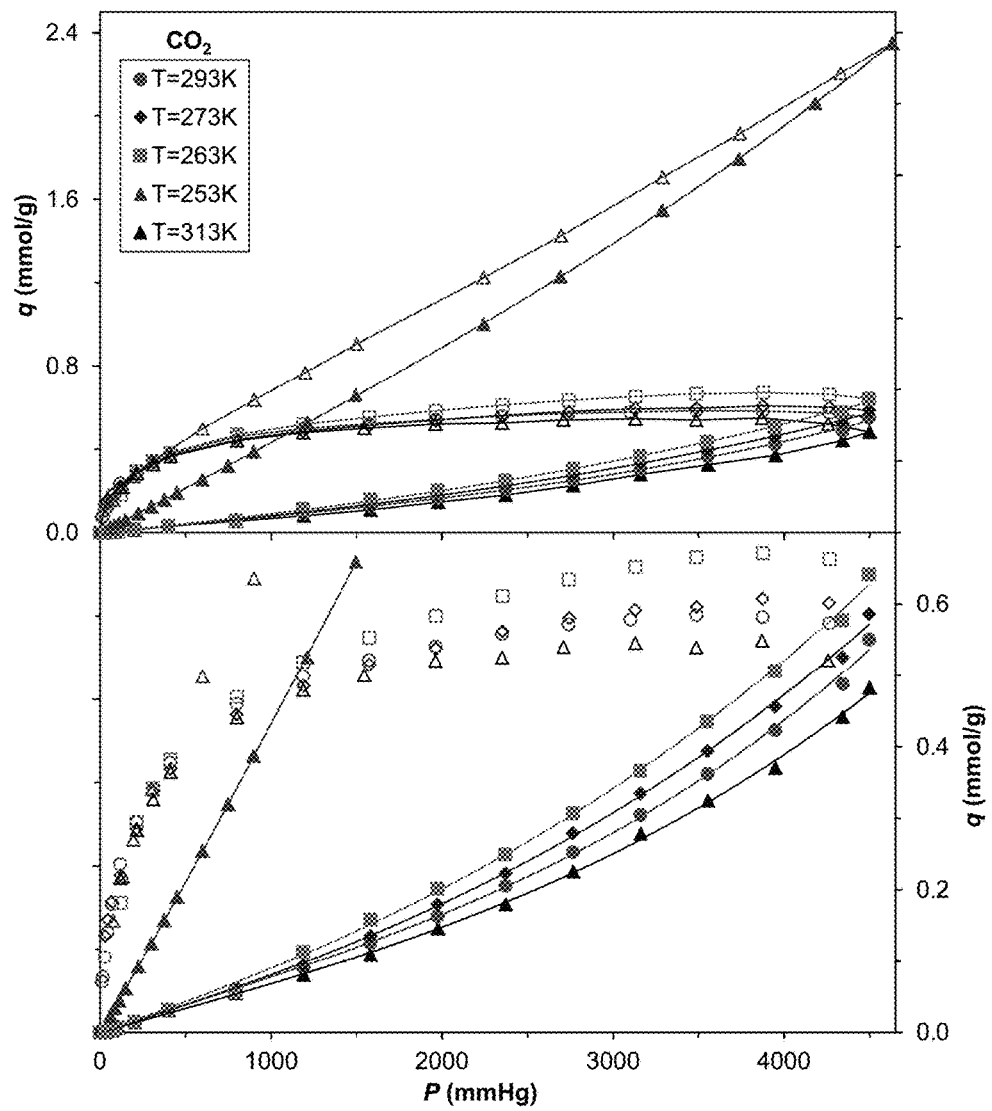
FIG. 5 shows adsorption isotherm for $CO_2$ uptake at 313, 293, 273, 263, and 253 K.
Figure 6:
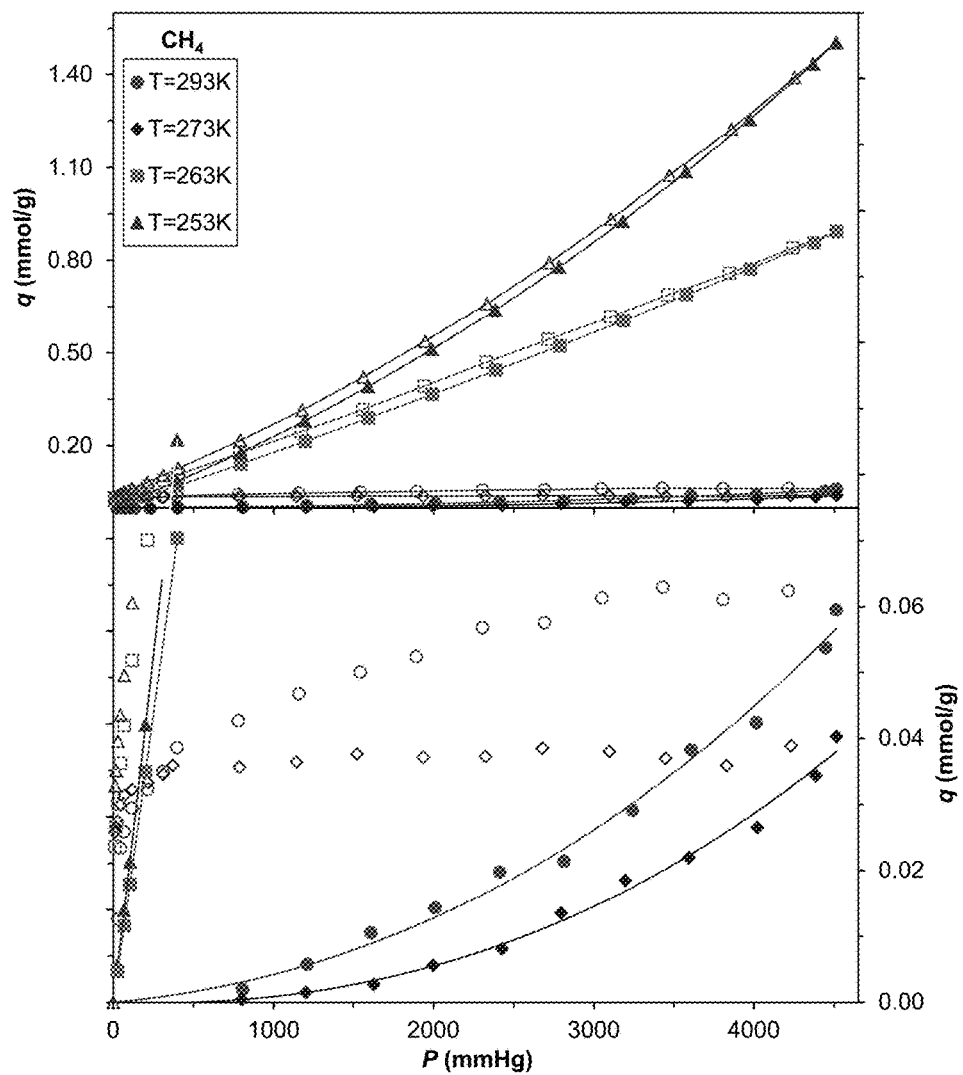
FIG. 6 shows adsorption isotherm for $CH_4$ uptake at 293, 273, 263, and 253 K.
Figure 7A:
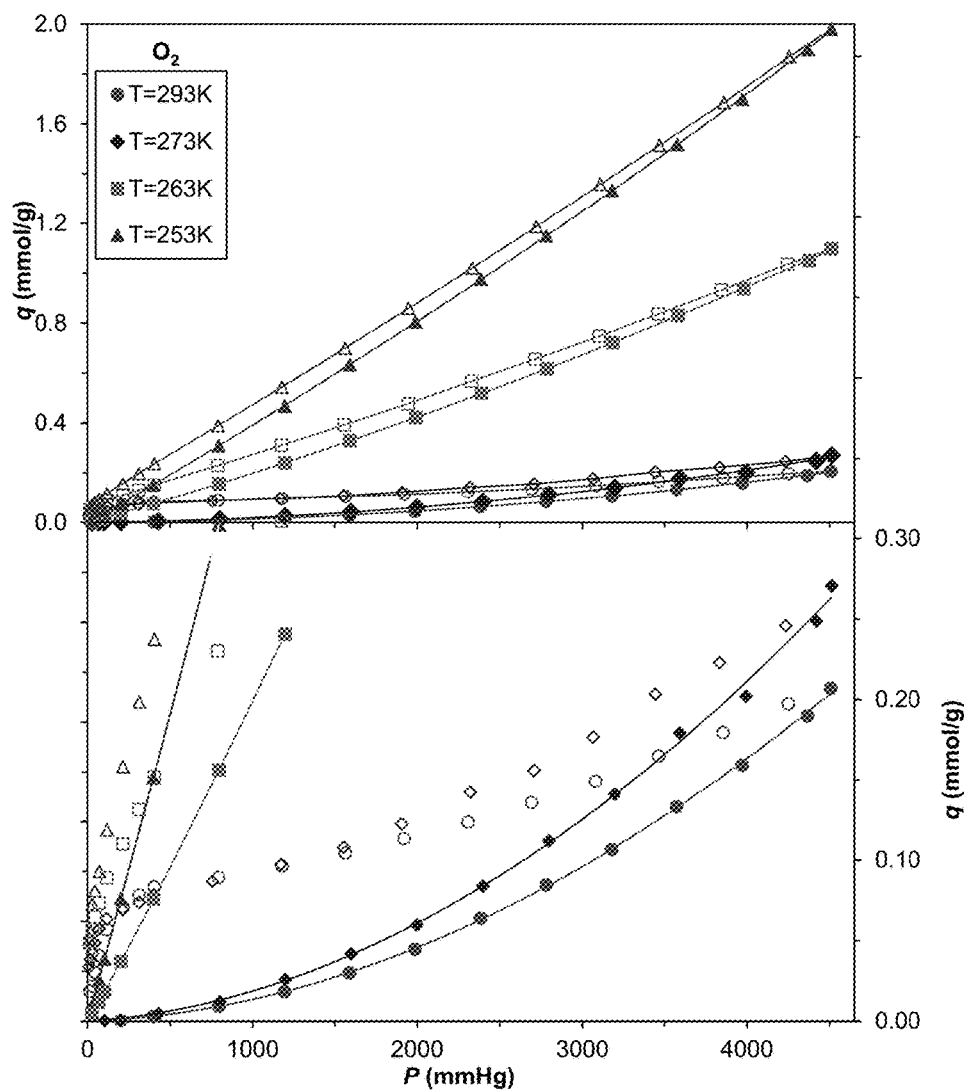
FIG. 7A shows adsorption isotherm for $O_2$ uptake at 293, 273, 263, and 253 K.
Figure 7B:
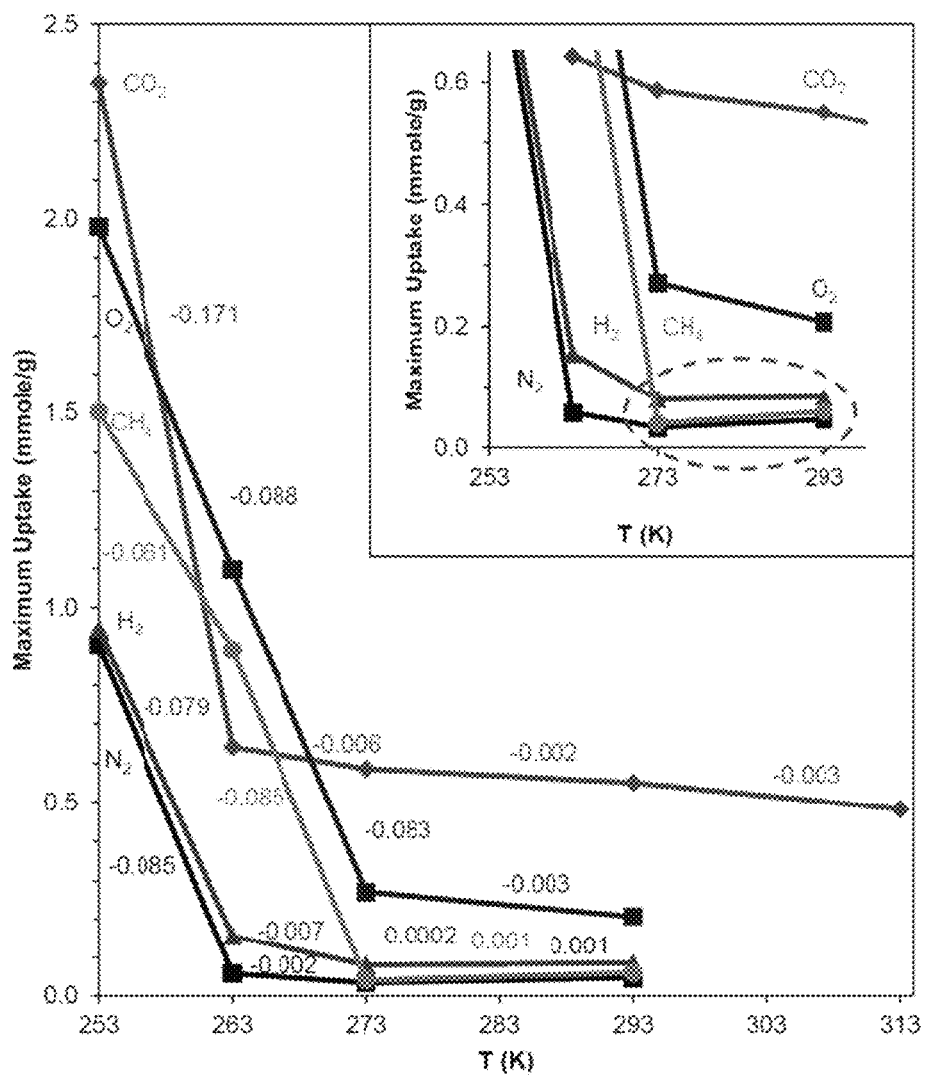
FIG. 7B shows the Performance of $Zn(NH_3)(CO_3)$ and other selected adsorbents in PSA-based oxy-fuel $CO_2$ purification. The highest value of each parameter is bolded.

Referring now to FIG. 2, the pattern of powder x ray diffraction ("PXRD") analysis performed on an "as-synthesized" sample and the simulated pattern of a phase pure product are shown. The pattern of the product repeated the simulated pattern. Therefore, the product was phase pure $Zn(NH_3)(CO_3)$.

Figure 29A:
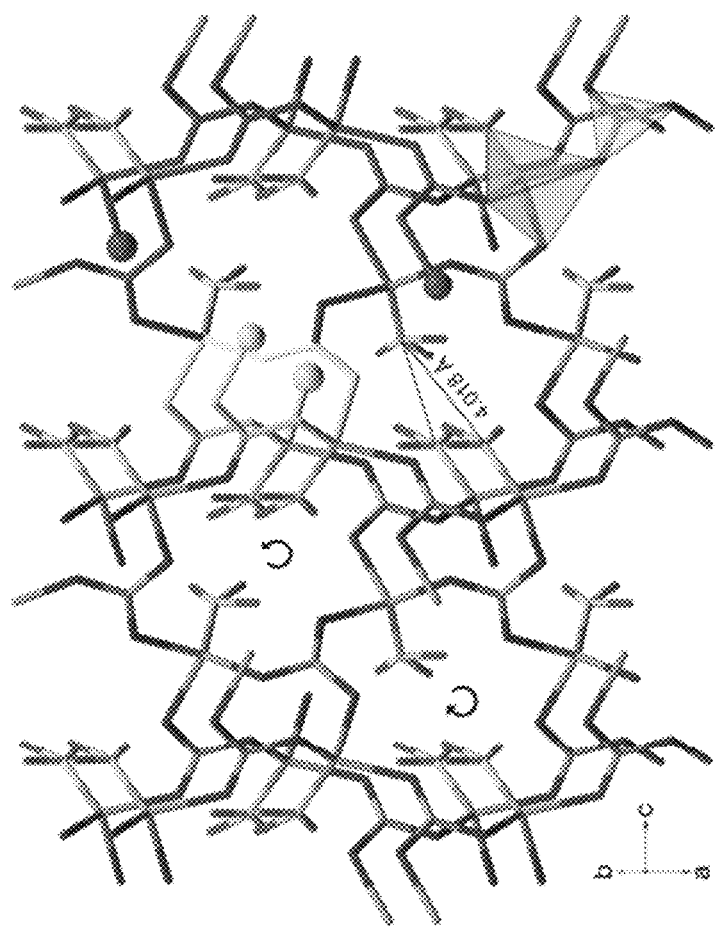
FIG. 29A shows the crystalline structure of $Zn(NH_3)(CO_3)$. $CO_3$ trigonal planars and $ZnO_3N$ tetrahedra are shown in gray and green, respectively. The circular arrows show the spiral directions of the folded helices. The (ZnOCO)$_2$ and (ZnOCO)$_4$ helices are visualized in orange and blue, respectively. The border of the helices is shown in yellow.
Figure 29B:
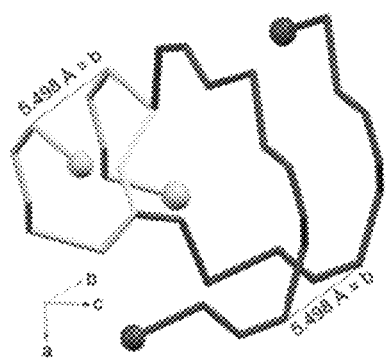
FIG. 29B shows the folded helices are shown in detail. Ammine ligands are eliminated for better visualization in this schematic.
Figure 29C:
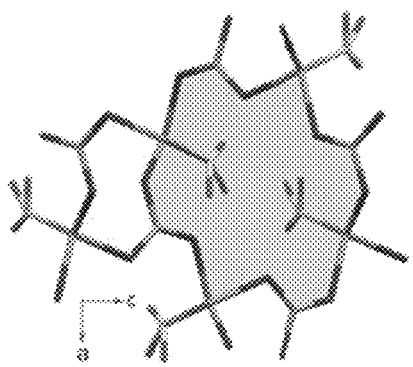
FIG. 29C shows the projection of crystalline structure in the b direction. The two types of microchannels with 8 and 16 components in the Zn(NH$_3$)(CO$_3$) helical framework are shown in yellow and cyan, respectively. (Legend: (Green: Zn; Gray: C; Red: O; Cyan: N; Magenta: H)).

The structure of $Zn(NH_3)(CO_3)$ is represented in FIG. 29*a-c*. As revealed by SC-XRD from ICSD #41113, $Zn(NH_3)(CO_3)$ has a helical crystalline framework, which is reproduced in FIG. 29*a*. The structure consists of $CO_3$ trigonal planars, each of which is isolated from the others by three $ZnO_3N$ tetrahedra that share oxygens in the corners, whereas each $ZnO_3N$ tetrahedron keeps the N corner unshared. Regardless of polar-polar interactions between O and H and between N and H of the adjacent tetrahedra, the tetrahedra are also isolated from each other. With this configuration of isolated tetrahedra and trigonal planars, Zn, C, and O create two types of folded helices that develop in the b direction (shown in orange and blue in FIG. 29*a, b*): 1) a small helix of $(ZnOCO)_2$, and 2) a big helix of $(ZnOCO)_4$ with two ammines pendant from every other zinc toward the axis of the big helix, whose nitrogens are 4.018 Å away from each other. The helices share the ZnOC piece of their backbones (shown in yellow in FIG. 29*a, b*) and the pitches of both helices are 5.498 Å, which is equal to the b dimension of the $Zn(NH_3)(CO_3)$ unit cell. The spiral direction of the helices in the c direction stays the same, but helices are packed with a right-handed/left-handed pattern in the a direction. The projection of the structure in the b direction visualizes two types of microchannels with 8 and 16 components, which are shown in yellow and cyan, respectively, in FIG. 29*c*.

Adsorption Isotherms

As can be seen from FIG. 29, the pendant ammines in the $(ZnOCO)_4$ helix have enough distance between them to accommodate small gas molecules such as $H_2$, $CO_2$, $O_2$, $N_2$, and $CH_4$, whose kinetic diameters range from 2.9 to 3.8 Å. The configuration of the (ZnOCO) in helices with a pitch of 5.498 Å could make the volume of the $(ZnOCO)_2$ helix accessible from the a and c directions for the molecules that can primarily diffuse to the $(ZnOCO)_4$ helix. Based upon these speculations, an adsorption property for this structure could be hypothesized. The adsorptives used for adsorption analysis in this study were $CO_2$, $N_2$, $H_2$, $O_2$, and $CH_4$. The physical properties of the adsorptives are tabulated in Table 3.1. The kinetic diameter is a critical property of the adsorptives that is effective in specifying the mechanism of adsorption. Polarizability is also influential on the strength of interaction between adsorbate and adsorbent in thermodynamic mechanism. Additionally, dipole moment is a significant measure for determining the strength of the interaction between adsorbate and adsorbent. Since the adsorptives of this study are all nonpolar, their dipole moments are zero.

TABLE 0.1

Physical properties of adsorptives.

| Adsorptive | Molecular weight (amu) | Boiling point (K) | Kinetic diameter (Å) | Polarizability ×10²⁵ (cm³) |
|---|---|---|---|---|
| $H_2$ | 2.016 | 20.27 | 2.89 | 8.042 |
| $N_2$ | 28.013 | 77.35 | 3.80 | 17.403 |
| $O_2$ | 31.999 | 90.17 | 3.46 | 15.812 |
| $CO_2$ | 44.01 | 216.55 | 3.3 | 29.11 |
| $CH_4$ | 16.034 | 111.66 | 3.76 | 25.93 |

Figure 8:
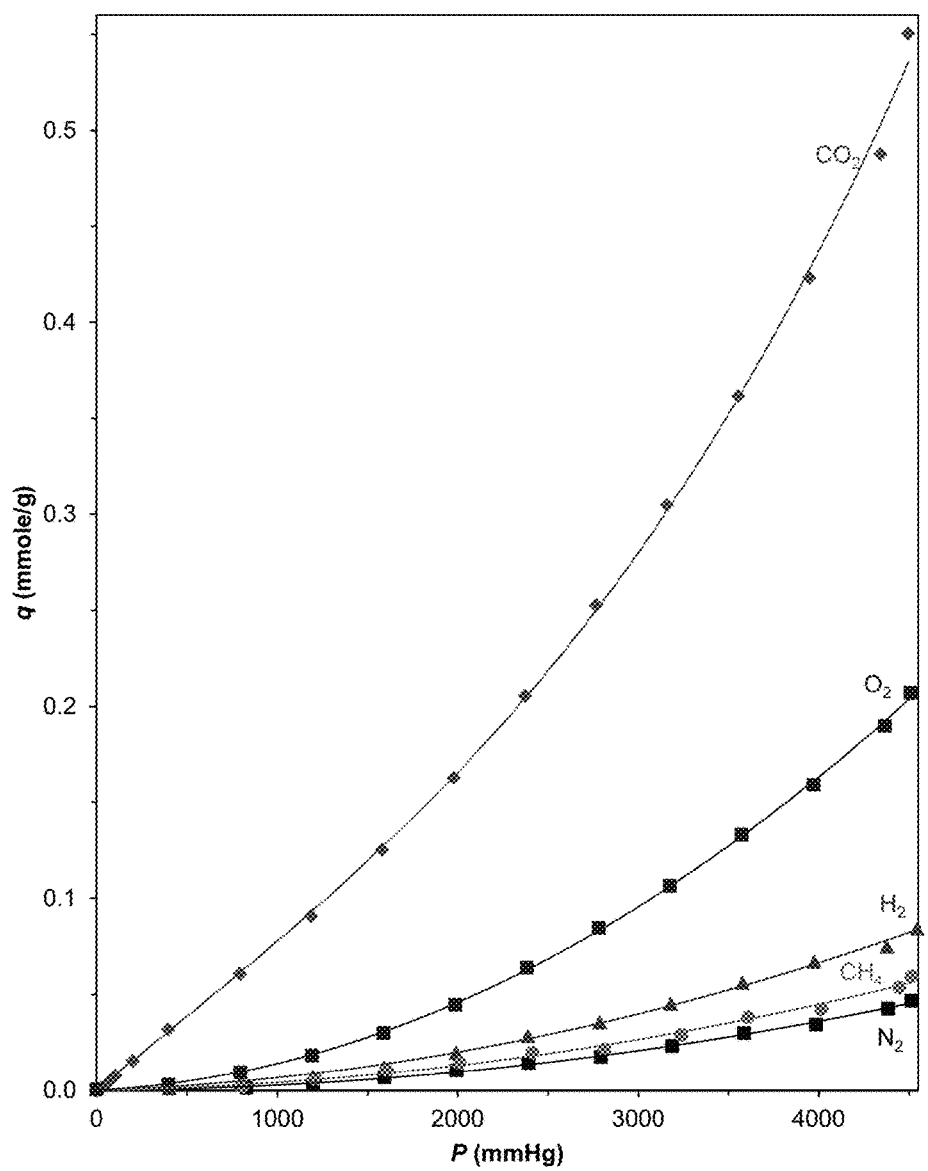
FIG. 8 shows the adsorption branches of the isotherms of $CO_2$, $O_2$, $H_2$, $CH_4$, and $N_2$ isotherms at 293 K for comparison.

Referring to FIGS. 3-7, the isotherms of $CO_2$ uptake at 253, 263, 273, 293, and 313 K and 0 to ~4500 mmHg and $N_2$, $H_2$, $CH_4$, and $O_2$ uptake at 253, 263, 273, and 293 K and 0 to ~4500 mmHg are shown. FIG. 8 shows the adsorption branches of all of these isotherms to allow better comparison of the adsorption behavior. The adsorption branches of the $N_2$, $H_2$, $CH_4$, and $O_2$ isotherms were convex toward the pressure axis, indicating poor interaction between these nonpolar adsorbates and the microchannels of the adsorbent. The isotherm of $CO_2$ uptake, in contrast, was concave to the pressure axis at lower pressures and deflects toward the uptake axis at approximately 1800 mmHg, indicating favorable adsorbate-adsorbent interaction at lower pressures. While $CO_2$ had a kinetic diameter of 3.3 Å, which was larger than the diameter of $H_2$ (2.9 Å) and smaller than $N_2$ (3.6 Å), the hydrogen-bond-type interaction between oxygens of $CO_2$ and hydrogens of pendant $NH_3$ gave rise to the shape of the adsorption branch of the isotherm as well as the uptake, 0.56 mmol/g, which was an order of magnitude higher than that of $H_2$, $O_2$, $CH_4$ and $N_2$.

Henry's Constants and Selectivities

Henry's constant, $K_H$, which is the ratio of uptake to pressure at equilibrium and at a concentration of the adsorbate that is sufficiently low to ignore adsorbate-adsorbate interaction (Equation 1.37), $$q = \frac{K'(T)_H p}{RT} = K_H(T)_p = K'(T)_H C \qquad \text{Eq. 0.1}$$

provides a quantitative measure for assessing the interaction of an adsorbate with an adsorbent and evaluating the selectivity of the synthesized material (Equation 1.67).

$$\alpha_{Hij} = \frac{K_{Hi}}{K_{Hj}} \qquad \text{Eq. 0.2}$$

Henry's constant can be calculated by fitting the isotherm data in a virial equation, expressed in Equation 1.51.

$$\frac{p}{q} = \frac{1}{K_H} \cdot \exp(C_1 q + C_2 q^2 + \ldots) \qquad \text{Eq. 0.3}$$

For low pressures and/or small uptakes, second and higher orders of q in Equation 1.51 are small enough to be ignored. Therefore, Equation 1.51 can be modified as follows:

$$\operatorname{Ln}\left(\frac{P}{q}\right) = C_1 q - \ln K_H \qquad \text{Eq. 0.4}$$

By performing linear regression of Ln(P/q) versus q and by extrapolating the fitted line to calculate the intercept, $K_H$ can be obtained. The calculated Henry's constants are shown in Table 3.4.

Henry's constant, derived from the adsorption isotherm of pure gas, is an asset for assessing the separation behavior of the material when it is exposed to a gas mixture. Table 3.5 shows the equilibrium separation selectivities of the material when it is exposed to the binary mixtures of $CO_2$, $N_2$, $H_2$, $O_2$, and $CH_4$ based on the ratio of Henry's constants (Equation 1.67).

Since adsorption at low temperatures is diffusion controlled the adsorbent does not offer significant equilibrium selectivity at 253 K. Rather, separation at this temperature should be based on adsorption kinetic. At 263 K, where adsorptions on $CO_2$, $N_2$, and $H_2$ are controlled by both diffusion and adsorption, the equilibrium selectivities of those binary mixtures increase.

TABLE 0.2

Henry's constants of $CO_2$, $N_2$, $H_2$, $O_2$, and $CH_4$ adsorption, calculated from virial isotherm.

| | $K_H$ (mmole/kPa · g) × $10^{-4}$ | | | |
|---|---|---|---|---|
| Adsorptive | 293 (K) | 273 (K) | 263 (K) | 253 (K) |
| $CO_2$ | 5.700 | 5.939 | 5.710 | 28.342 |
| $N_2$ | 0.091 | 0.036 | 0.166 | 15.742 |
| $H_2$ | 0.184 | 0.079 | 1.361 | 15.663 |
| $O_2$ | 0.506 | 0.634 | 12.717 | 27.832 |
| $CH_4$ | 0.158 | 0.036 | 12.804 | 15.361 |

TABLE 0.3

Estimated selectivities for binary mixtures of $CO_2$, $N_2$, $H_2$, $O_2$, and $CH_4$ by $Zn(NH_3)(CO_3)$ at 293, 273, 263, and 253 K.

| Gas Mixture | $\alpha_{Hij}$ | | | |
|---|---|---|---|---|
| | 293 (K) | 273 (K) | 263 (K) | 253 (K) |
| $CO_2/CH_4$ | 36.0 | 166.6 | 0.4 | 1.8 |
| $CO_2/H_2$ | 31.1 | 75.1 | 4.2 | 1.8 |
| $CO_2/N_2$ | 62.9 | 166.0 | 34.3 | 1.8 |
| $CO_2/O_2$ | 11.3 | 9.4 | 0.4 | 1.0 |
| $H_2/N_2$ | 2.0 | 2.2 | 8.2 | 1.0 |
| $O_2/N_2$ | 5.6 | 17.7 | 76.5 | 1.8 |

The maximum selectivity for air separation ($N_2/O_2$ mixture) can be achieved at 263 K, where $O_2$ adsorption is still in diffusion-controlled domain, but where $N_2$ has entered the dual-controlled mode. Separation of $CO_2$ from $O_2$ and $CH_4$ at this temperature is not advantageous because of $CO_2$ adsorption being in dual-controlled mode. The largest equilibrium selectivities for $CO_2$ separation are exhibited at 273 K, where adsorptions of all gases are in the dual-controlled domain. Selectivities of $CO_2$ separation from $N_2$, $H_2$, and $CH_4$ at 293 K have decreased compared to 273 K because uptakes of those gases have increased at 293 K in comparison to 273 K (see the inset of FIG. 7.5).

Selectivity Based on IAST

As explained in Subsection 1.6.8.2, IAST is capable of predicting the composition of the adsorbed phase for a given binary mixture of adsorptives with known q=f(p) isotherm data of pure components of the mixture. Once the composition of adsorptive and adsorbate phases is known, selectivity ($\alpha_{Hij}$) can be calculated. This section calculates $\alpha_{Hij}$ for selected binary mixtures with potential industrial significance (Table 3.6) at varied pressures (0 to 4600 mmHg) and temperatures (293 and 273 K) to evaluate the functionality of the selectivity with pressure and temperature.

To find q=f(p), isotherm data were fitted into polynomial equations, and the equations were plugged into Equation 1.71.

$$\int_{t=0}^{P\frac{y_1}{x_1}} q_1(t) \frac{dt}{t} = \int_{t=0}^{P\frac{y_2}{x_2}} q_2(t) \frac{dt}{t} \qquad \text{Eq. 0.5}$$

The integrals of Equation 1.71 can be solved for a sample polynomial q=f(p) with n=3 as follows:

$$\int_{t=0}^{P\frac{y_1}{x_1}} (at^3 + bt^2 + ct) \frac{dt}{t} = \frac{a}{3}\left(P\frac{y_1}{x_1}\right)^3 + \frac{b}{2}\left(P\frac{y_1}{x_1}\right)^2 + c\left(P\frac{y_1}{x_1}\right) \qquad \text{Eq. 0.6}$$

Equation 1.71, with the solution in the form of Equation 3.21, can be solved by trial and error for a given P to calculate equivalent $x_1$ (and thus $x_2$).

TABLE 0.4

Binary mixtures of $CO_2$, $N_2$, $H_2$, $O_2$, and $CH_4$ and their potential industrial significance considered for calculation of $\alpha_{Hij}$.

| Gas Mixture | Composition (%/%) | Significance |
|---|---|---|
| $CO_2/CH_4$ | 10/90 | Natural gas purification |
| $CO_2/CH_4$ | 50/50 | Landfill gas separation |
| $CO_2/H_2$ | 40/60 | Syngas separation |
| $CO_2/N_2$ | 10/90 | Flue gas separation |
| $CO_2/O_2$ | 90/10 | Oxy-fuel gas separation |
| $H_2/N_2$ | 50/50 | — |

Figure 9:
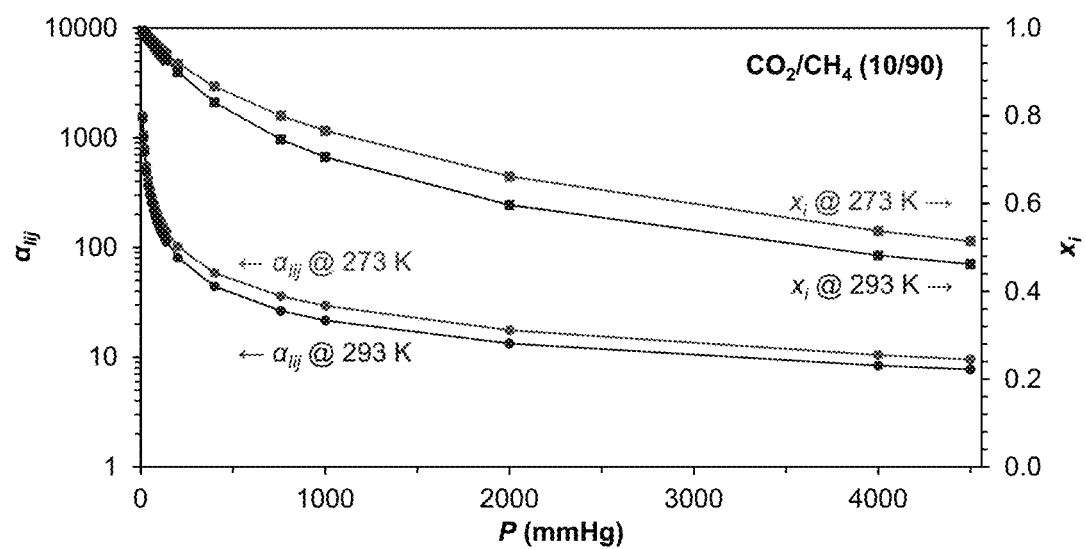
FIG. 9 shows the variation of composition of adsorbed phase and separation selectivity by $Zn(NH_3)(CO_3)$, with pressure calculated by IAST method for binary mixture of $CO_2/CH_4$ (10/90) at 273 and 293 K.
Figure 10:
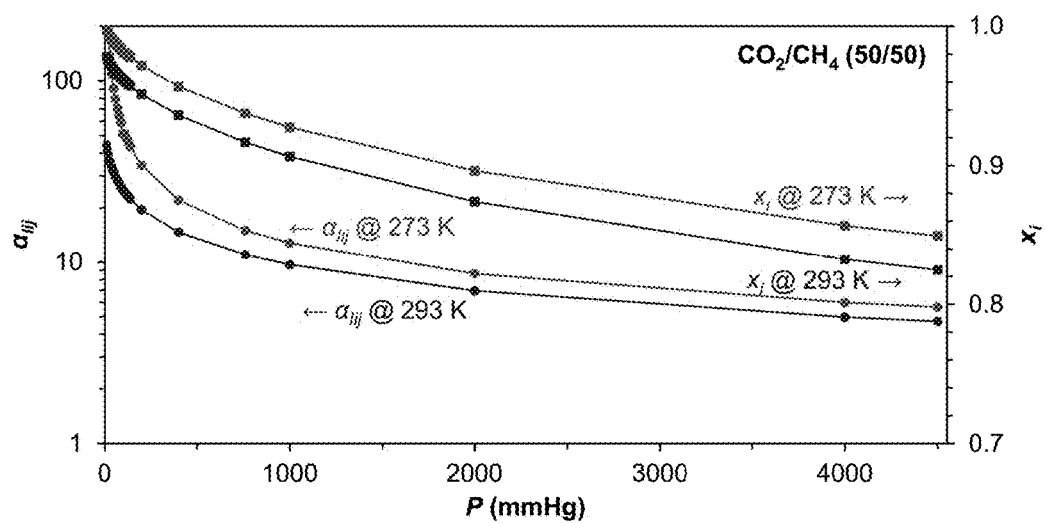
FIG. 10 shows the variation of composition of adsorbed phase and separation selectivity by $Zn(NH_3)(CO_3)$, with pressure calculated by IAST method for binary mixture of $CO_2/CH_4$ (50/50) at 273 and 293 K.
Figure 11:
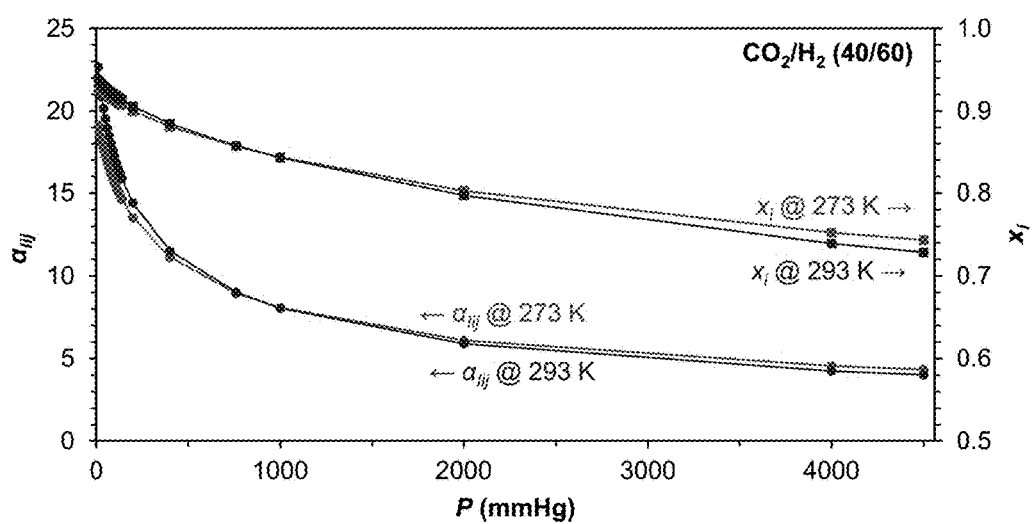
FIG. 11 show the variation of composition of adsorbed phase and separation selectivity by $Zn(NH_3)(CO_3)$, with pressure calculated by IAST method for binary mixture of $CO_2/H_2$ (40/60) at 273 K and 293 K.
Figure 12:
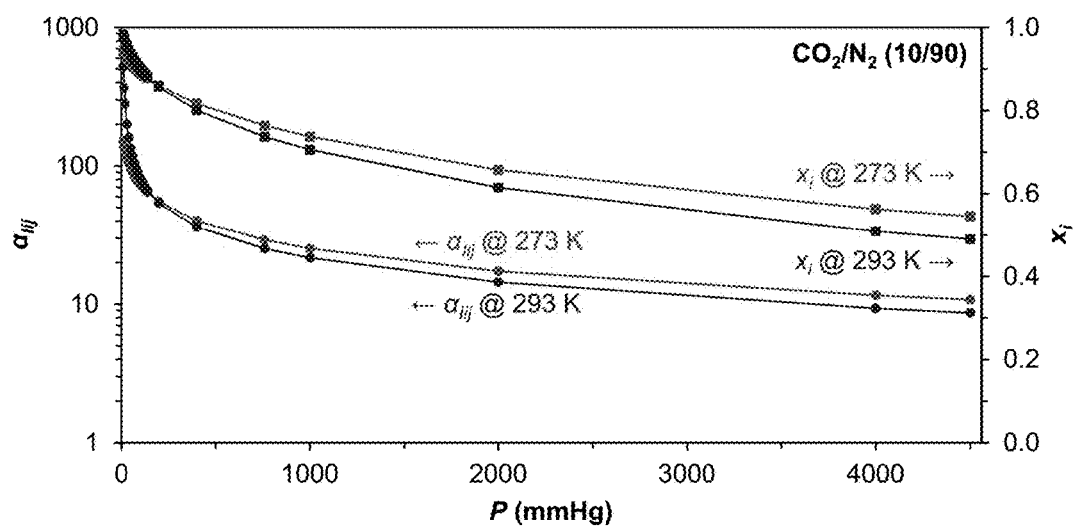
FIG. 12 shows the variation of composition of adsorbed phase and separation selectivity by $Zn(NH_3)(CO_3)$, with pressure calculated by IAST method for binary mixture of $CO_2/N_2$ (10/90) at 273 K and 293 K.
Figure 13:
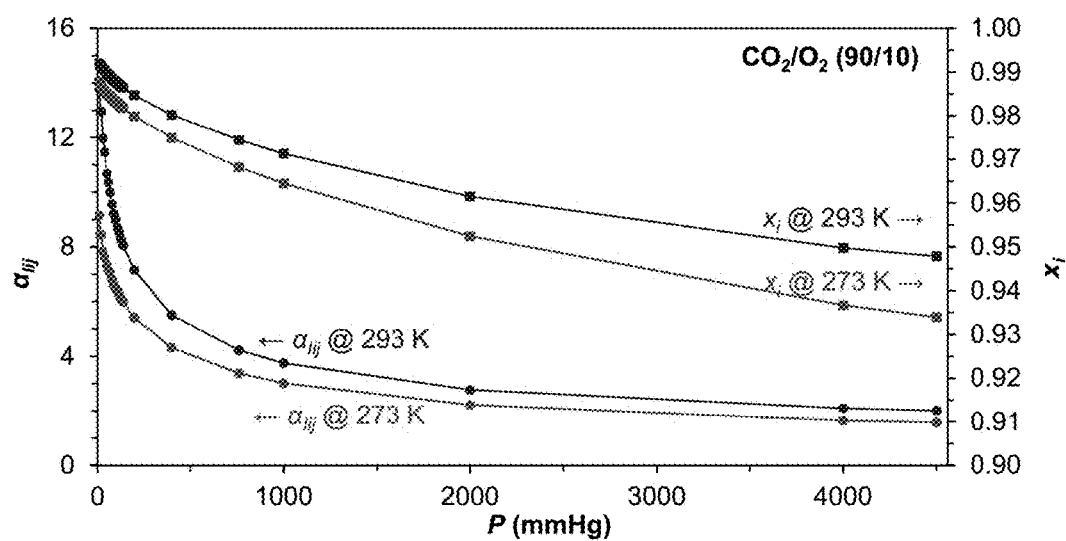
FIG. 13 shows the variation of composition of adsorbed phase and separation selectivity by $Zn(NH_3)(CO_3)$, with pressure calculated by IAST method for binary mixture of $CO_2/O_2$ (90/10) at 273 K and 293 K.
Figure 14:
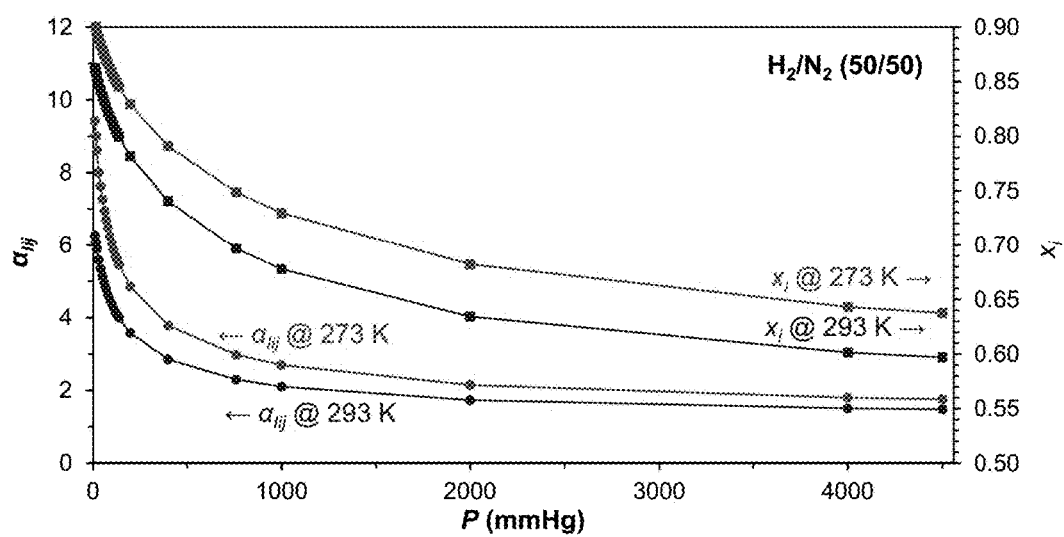
FIG. 14 shows the variation of composition of adsorbed phase and separation selectivity by $Zn(NH_3)(CO_3)$, with pressure calculated by IAST method for binary mixture of $H_2/N_2$ (50/50) at 273 K and 293 K.
Figure 15:
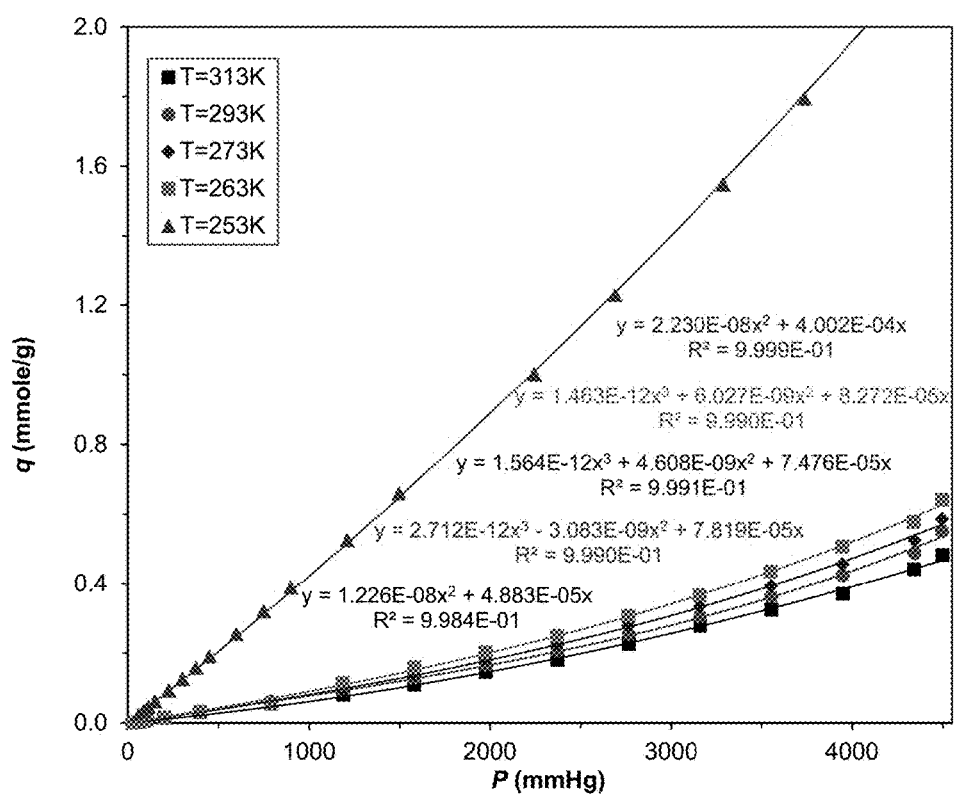
FIG. 15 shows the Polynomial fittings of $CO_2$ (P,q) isotherm data.
Figure 16:
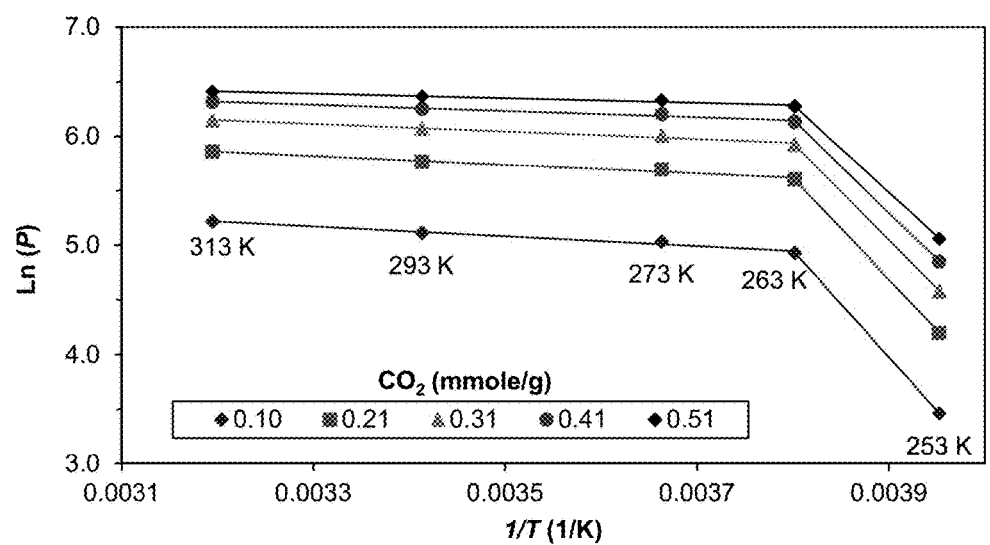
FIG. 16 shows sample isosteres of $CO_2$ and temperature windows of diffusion- and adsorption-controlled domains.
Figure 17:
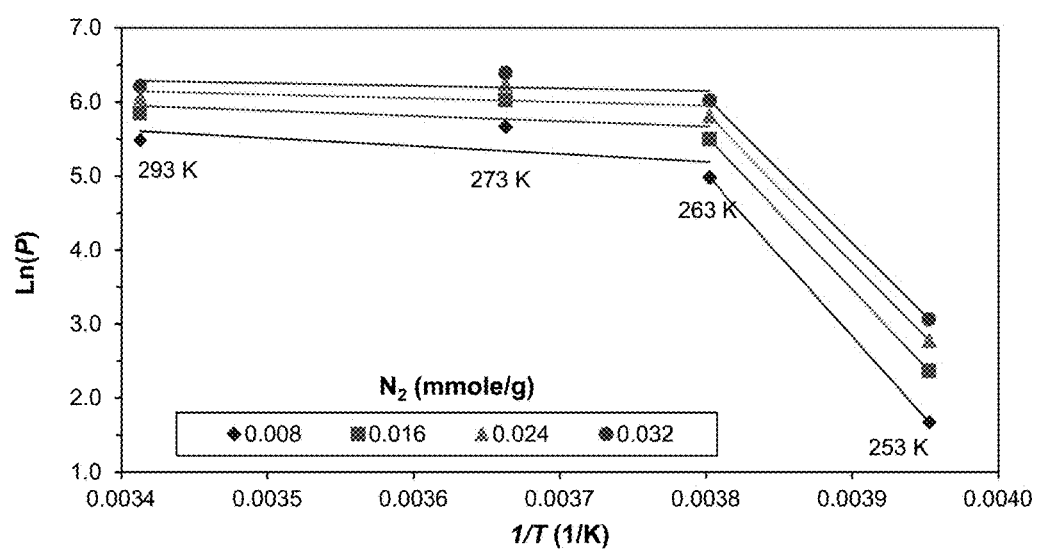
FIG. 17 shows sample isosteres of $N_2$ and temperature windows of diffusion- and adsorption-controlled domains.
Figure 18:
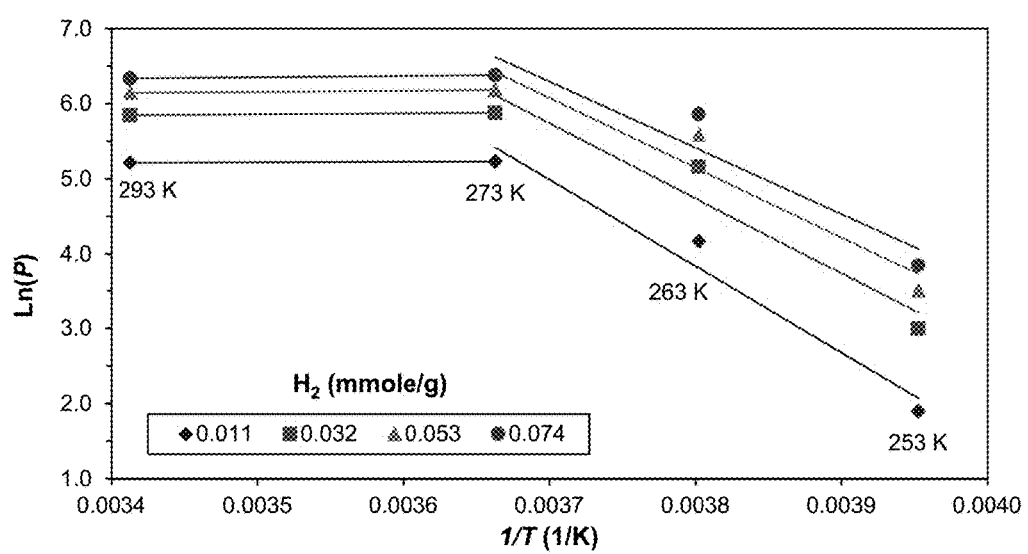
FIG. 18 shows sample isosteres of $H_2$ and temperature windows of diffusion- and adsorption-controlled domains.
Figure 19:
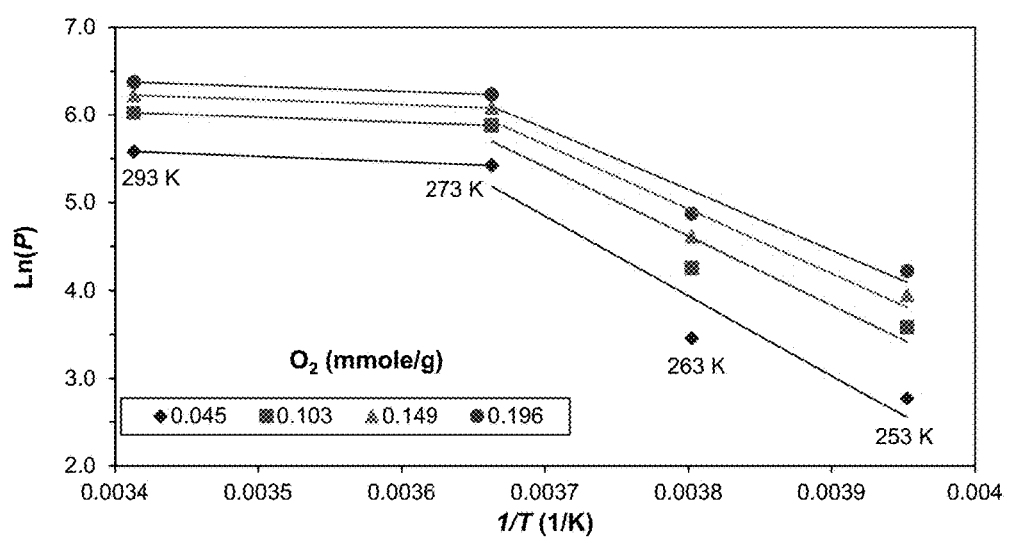
FIG. 19 shows sample isosteres of $O_2$ and temperature windows of diffusion- and adsorption-controlled domains.
Figure 20:
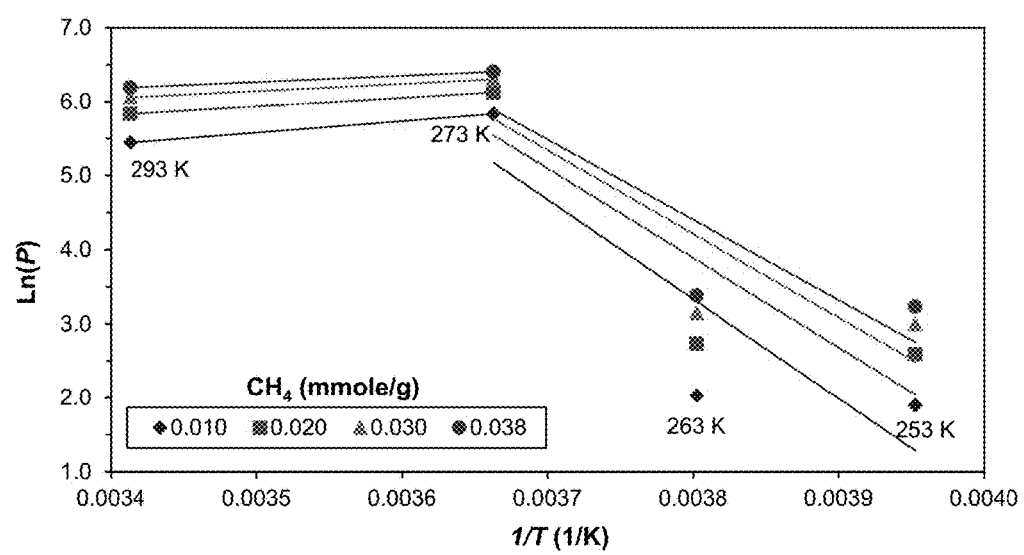
FIG. 20 shows sample isosteres of $CH_4$ and temperature windows of diffusion- and adsorption-controlled domains.
Figure 21:
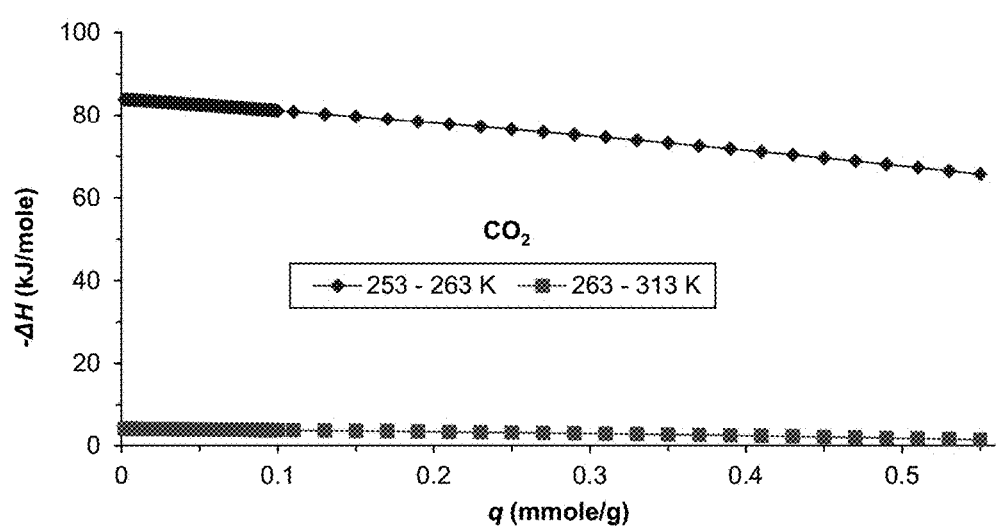
FIG. 21 shows Isosteric heat of adsorption of $CO_2$ calculated for diffusion-controlled (diamond) and adsorption-controlled domains (square)
Figure 22:
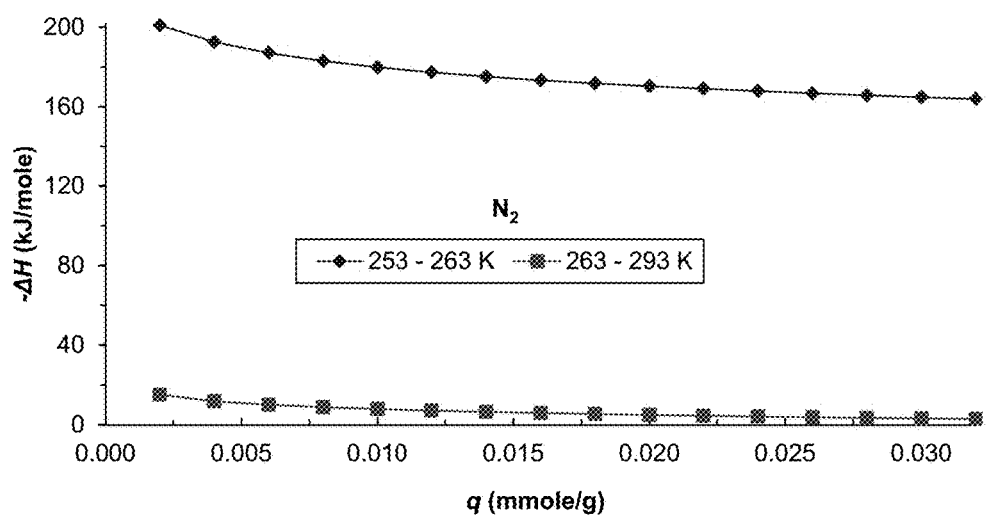
FIG. 22 shows Isosteric heat of adsorption of $N_2$ calculated for diffusion-controlled (diamond) and adsorption-controlled domains (square)
Figure 23:
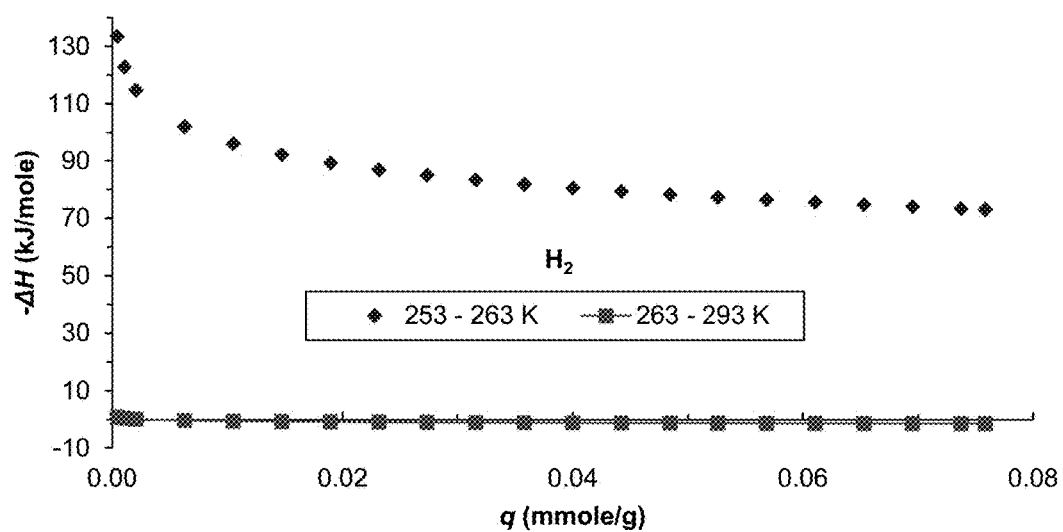
FIG. 23 shows Isosteric heat of adsorption of $H_2$ calculated for diffusion-controlled (diamond) and adsorption-controlled domains (square)
Figure 24:
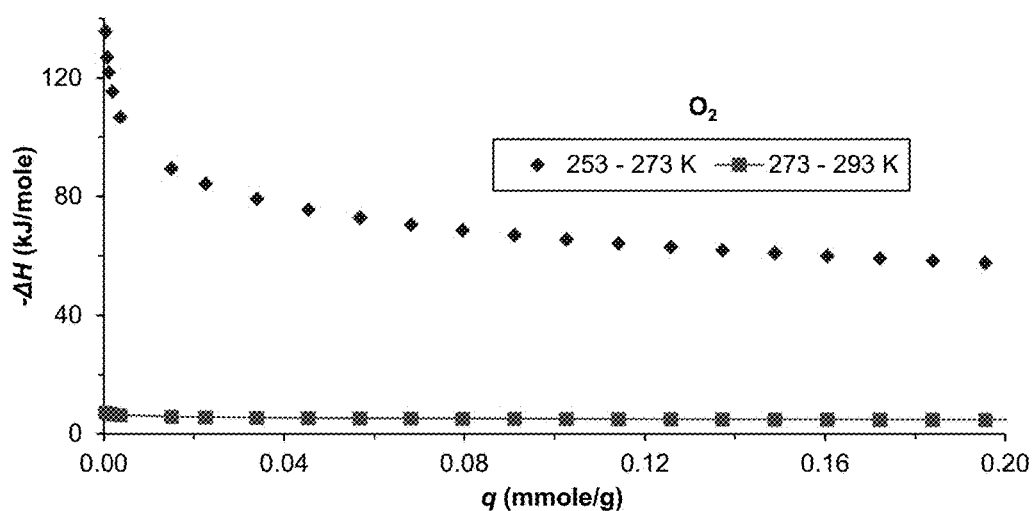
FIG. 24 shows Isosteric heat of adsorption of $O_2$ calculated for diffusion-controlled (diamond) and adsorption-controlled domains (square)
Figure 25:
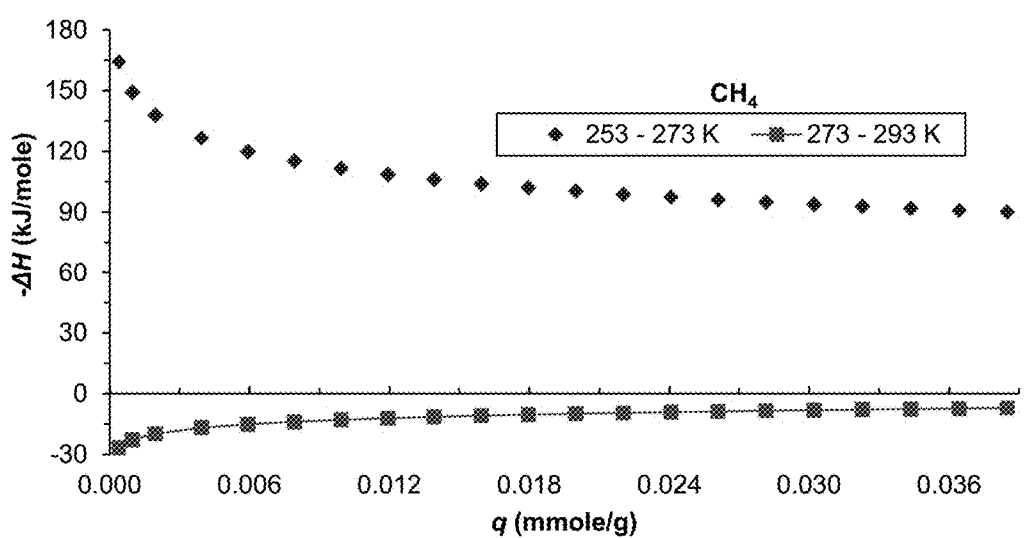
FIG. 25 shows Isosteric heat of adsorption of $CH_4$ calculated for diffusion-controlled (diamond) and adsorption-controlled domains (square)
Figure 26:
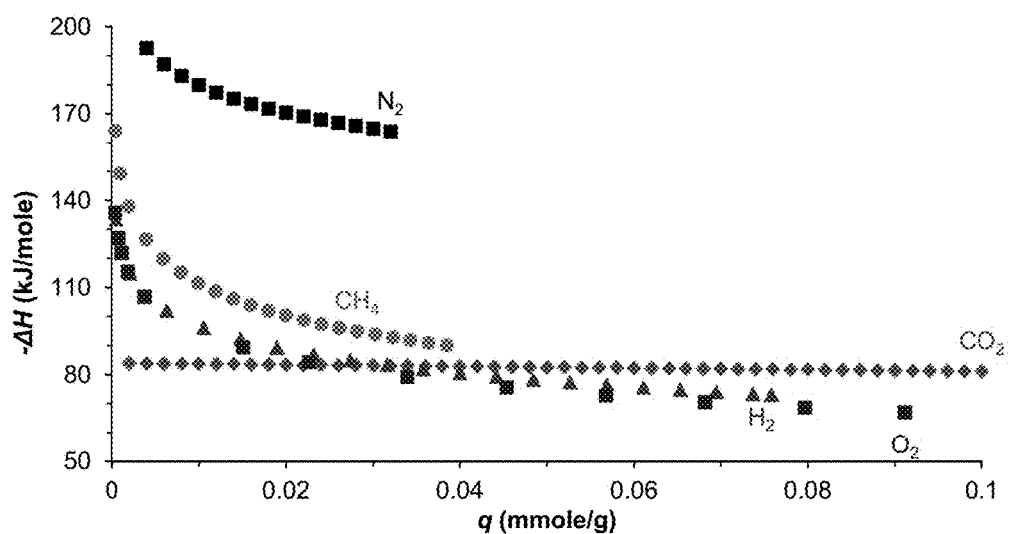
FIG. 26 shows Isosteric heats of adsorption of $CO_2$, $N_2$, $H_2$, $O_2$, and $CH_4$ at diffusion-controlled domain.
Figure 27:
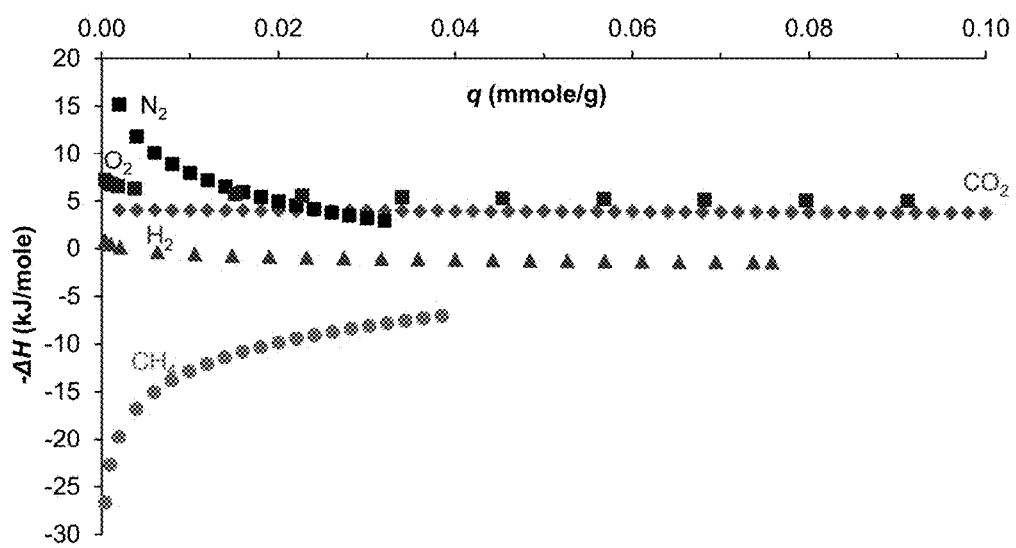
FIG. 27 shows Isosteric heats of adsorption of $CO_2$, $N_2$, $H_2$, $O_2$, and $CH_4$ at adsorption-controlled domain.

FIG. 9 shows the varied compositions of the adsorbed phase and the separation selectivities by $Zn(NH_3)(CO_3)$ with pressure at 273 K and 293 K for a binary mixture of $CO_2/CH_4$ (10/90), FIG. 10 shows the same for $CO_2/CH_4$ (50/50), FIG. 11 for $CO_2/H_2$ (40/60), FIG. 12 for $CO_2/N_2$ (10/90), FIG. 13 for $CO_2/O_2$ (90/10), and FIG. 14 for $H_2/N_2$ (50/50).

The common feature of all separations is an exponential decrease of selectivity and therefore, the composition of more adsorbed adsorptive as pressure—i.e., uptake—increases. This behavior can be attributed to the effect of adsorbate-adsorbate interaction in the selectivity of adsorbent as uptake increases.

Selectivity, as a ratio of Henry's constants of the separation mixture, ($\alpha_{Hij}$), is a measure of the adsorbent's behavior at low pressures. The values of $\alpha_{Hij}$ for separation by $Zn(NH_3)(CO_3)$ were calculated and tabulated in Table 3.5. To compare the selectivity based on Henry's constant and IAST, $\alpha_{Hij}$ at 10 mmHg and $\alpha_{Hij}$ at 293 K and 273 K are compared in Table 3.7.

The values of $\alpha_{Iij}$ and $\alpha_{Hij}$ at 293 K and 273 K for separation of $CO_2/CH_4$ (10/90) are far different. On the other hand, $\alpha_{Iij}$ and $\alpha_{Hij}$ have the same order of magnitude at 293 K and 273 K for the separation of the same components but different concentrations: $CO_2/CH_4$ (50/50). This discrepancy of selectivities for the separation of 10/90 mixture is related to the inaccuracy of IAST method for predicting the composition of the adsorbed phase of the mixture with high concentrations of the less-adsorbed component (here, $CH_4$ with concentration of 90%). A similar discrepancy can be observed between $\alpha_{Iij}$ and $\alpha_{Hij}$ for the separation of $CO_2/N_2$ (10/90). The agreement between $\alpha_{Iij}$ and $\alpha_{Hij}$ increased as the concentration of the less-adsorbed component decreased, and the highest agreement was observed for $CO_2/O_2$ (90/10), where at 293 K, $\alpha_{Iij}$ and $\alpha_{Hij}$ are 11.3 and 13.8, respectively, and 9.4 and 9.2, respectively, at 273 K.

At low pressures, IAST predicts that the concentration of adsorbed $CO_2$ and consequently the selectivity for the separation of $CO_2/H_2$ (40/60) and $CO_2/N_2$ (10/90) at 273 K are smaller than at 293 K (see FIGS. 11 and 12). However, the trends reverse as pressure increases (approximately 700 mmHg for $CO_2/H_2$ (40/60) and 150 mmHg for $CO_2/N_2$ (10/90)). Such changes in selectivity and the concentration of the adsorbed phase are congruent with $H_2$ and $N_2$ isotherms at 293 K and 273 K (see FIGS. 4 and 3). The values of $\alpha_{Hij}$ at 293 K and 273 K agree with the IAST trend at higher pressure ($\alpha_{Hij}$ at 273 is larger than $\alpha_{Hij}$ at 293 K). That is because the uptakes at larger pressures were used to calculate $\alpha_{Hij}$.

As FIG. 13 shows, IAST predicts the concentration of adsorbed $CO_2$ and the selectivity of $CO_2/O_2$ (90/10) separation at 293 K to be larger than those at 273 K. This trend agrees with the trend of $\alpha_{Hij}$ at 293 K and 273 K represented in Table 3.5.

TABLE 0.5

Comparison of $\alpha_{Hij}$ and $\alpha_{Iij}$ at 293 K and 273 K for different binary mixtures.

| Gas Mixture (%/%) | 293 (K) $\alpha_{Hij}$ | 293 (K) $\alpha_{Iij}$[a] | 273 (K) $\alpha_{Hij}$ | 273 (K) $\alpha_{Iij}$[a] |
|---|---|---|---|---|
| $CO_2/CH_4$ (10/90) | 36.0 | 1491.0 | 166.6 | 1583.9 |
| $CO_2/CH_4$ (50/50) | 36.0 | 44.5 | 166.6 | 351.1 |
| $CO_2/H_2$ (40/60) | 31.1 | 22.7 | 75.1 | 19.1 |
| $CO_2/N_2$ (10/90) | 62.9 | 520.4 | 166.0 | 152.1 |
| $CO_2/O_2$ (90/10) | 11.3 | 13.8 | 9.4 | 9.2 |
| $H_2/N_2$ (50/50) | 2.0 | 6.3 | 2.2 | 9.4 |

[a] Calculated at 10 mmHg

BET Analysis and Structural Stability

Figure 28:
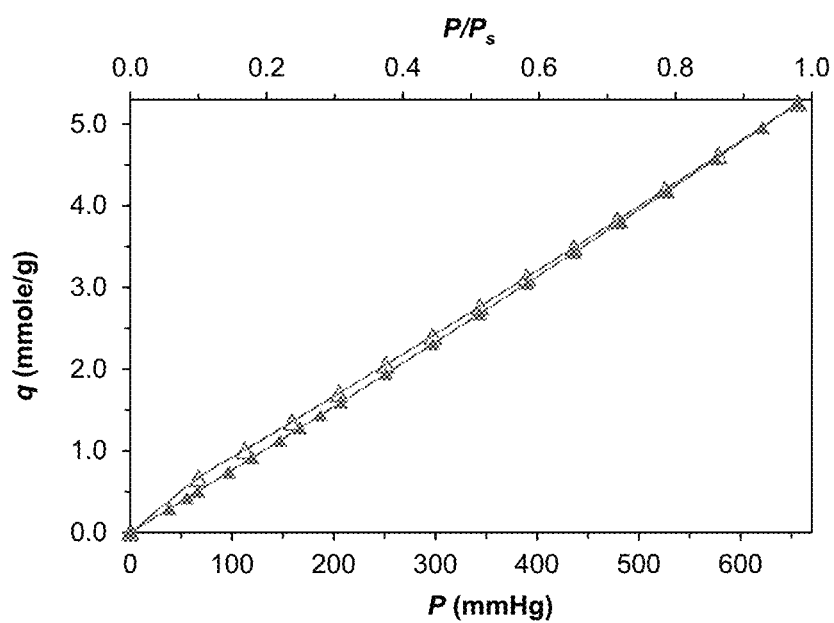
FIG. 28 shows $N_2$ adsorption isotherm at 77 K by $Zn(NH_3)(CO_3)$, used to calculate BET surface area. Filled and open symbols represent adsorption and desorption data, respectively.

To calculate the BET surface area, $N_2$ adsorption analysis by $Zn(NH_3)(CO_3)$ was performed at 77 K. FIG. 28 shows the adsorption isotherm of the material. 5.3 mmole/g of $N_2$ was adsorbed at the relative pressure (P/P$_s$) of 0.995. The adsorption branch of the isotherm is almost linear, and hysteresis at lower pressure could still be observed.

The equivalent BET surface area calculated for the $Zn(NH_3)(CO_3)$ framework is 207 m$^2$/g. The C-value and correlation coefficient were calculated as 2.44 and 0.9973, respectively. The C-value, a parameter used for fitting the BET equation, is exponentially related to the enthalpy of adsorption in the first layer of adsorbed gas, and it is a qualitative measure for adsorbate-adsorbent interaction. The obtained BET surface area is in the range of the values reported for other ultramicroporous materials.

To assess if the material is sufficiently structurally robust to withstand the recurring cycles of adsorption and desorption that commonly occur in separation processes, a comparison was performed between the $CO_2$ adsorption isotherms of a sample of fresh $Zn(NH_3)(CO_3)$ and $Zn(NH_3)(CO_3)$ subjected to 80 cycles of adsorption and desorption. The maximum uptake at 4500 mmHg for the used sample was only 0.8% less than the uptake of the fresh sample, indicating that the material structure is stable under the cyclical adsorption-desorption process.

In addition to structural stability, as the adsorption analysis procedure implies, $Zn(NH_3)(CO_3)$ is thermally stable at 110° C. To check the chemical stability in water, the crystals were mixed in water for weeks, a procedure that was found not to affect $Zn(NH_3)(CO_3)$ structure.

Potential Industrial Applications

As previously discussed there are $CO_2$ separation processes associated with power generation, in which $CO_2/N_2$, $CO_2/H_2$, and $CO_2/O_2$ are good constituents of post-combustion, pre-combustion, and oxy-fuel $CO_2$ capture, respectively. In addition to power generation sector, the natural gas industry is another sector facing the challenge of $CO_2$ separation. An important component of natural gas is $CH_4$ (80-95%), and it also includes impurities composed of $N_2$, $CO_2$, $H_2$, other hydrocarbons heavier than $CH_4$, and traces of other materials such as water and sulphur. Landfill gas (LFG) is another source of $CH_4$. LFG comprises 45-60% $CH_4$ and 40-60% $CO_2$. $CO_2$ separation from $CH_4$ is necessary to upgrade the natural gas and prevent pipeline corrosion.

As explained above, $Zn(NH_3)(CO_3)$ is thermally, chemically, and structurally robust enough to withstand the operating conditions of $CO_2$ separation processes. In the present subsection, the adsorption selection criteria are calculated for $Zn(NH_3)(CO_3)$ for the above-mentioned $CO_2$ separation processes by Pressure swing adsorption ("PSA") or Vacuum swing adsorption ("VSA"), and the values are compared with those of other adsorbents. For each process, a binary mixture with an average composition is selected, and adsorption pressure ($P_{ads}$) and desorption pressure ($P_{des}$) are set close to the conditions of upstream industrial operations. The criteria used to evaluate the adsorbents' performances are uptake capacity (q), working capacity ($\Delta q$), working selectivity ($\alpha_{qij}$), regenerability (R), and adsorbent selection parameter (S). Out of this analysis and comparison, the suitability of the adsorbent for a specific application can be assessed.

Natural Gas Purification Using PSA

Typical operating conditions for natural gas purification using PSA are as follows:

$CO_2/CH_4$ composition: 10/90

$P_{ads}/P_{des}$: 5 atm/1 atm

T: Room temperature (RT)

Table 3.9 tabulates the calculated values of the selection parameters for $Zn(NH_3)(CO_3)$ and other prominent adsorbents. $Zn(NH_3)(CO_3)$ exhibits the highest R, which is the result of the type of isotherm. However, since the partial pressure of the $CO_2$ in the mixture is low, q and $\Delta q$ of the adsorbent are lower than other adsorbents. Moreover, other adsorbents are better candidates with respect to the working selectivity and S. All in all, $Zn(NH_3)(CO_3)$ is not the best candidate for PSA-based natural gas purification.

TABLE 0.6

Performance of Zn(NH₃)(CO₃) and other selected adsorbents in PSA-based natural gas purification.
The highest value of each parameter is bolded.

| Adsorbent | T (K) | q (mmole/g) | Δq (mmole/g) | R (%) | $\alpha_{qij}$ | S |
|---|---|---|---|---|---|---|
| Zn(NH₃)(CO₃) | 293 | 0.027 | 0.022 | 80.9 | 7.2 | 1.4 |
| POP1[a] | 298 | 1.39 | 0.86 | 62.2 | 9.7 | 7.5 |
| MOF1[b] | 303 | 0.89 | 0.62 | 69.7 | 16.7 | 18.7 |
| HKUST-1 MOF | 298 | 2.07 | 1.70 | 63.0 | 10.0 | 9.6 |
| Zeolite-13X | 298 | 3.97 | 1.48 | 37.3 | 18.9 | 9.0 |

[a]Diimide porous organic polymer (POP)
[b]Amine-Al-MIL-53

LFG Separation Using PSA

Typical operating conditions for this process are as follows:

CO₂/CH₄ composition: 50/50
$P_{ads}/P_{des}$: 5 atm/1 atm
T: RT

Table 3.10 tabulates the calculated values of the selection parameters for Zn(NH₃)(CO₃) and other prominent adsorbents. Regardless of q and Δq, Zn(NH₃)(CO₃) provides higher R, $\alpha_{qij}$, and S values than other known candidates. Therefore, Zn(NH₃)(CO₃) can be an appropriate adsorbent for LFG separation by PSA.

TABLE 0.7

Performance of Zn(NH₃)(CO₃) and other selected adsorbents in PSA-based LFG separation.
The highest value of each parameter is bolded.

| Adsorbent | T (K) | q (mmole/g) | Δq (mmole/g) | R (%) | $\alpha_{qij}$ | S |
|---|---|---|---|---|---|---|
| Zn(NH₃)(CO₃) | 293 | 0.158 | 0.131 | 82.9 | 13.5 | 50.7 |
| HKUST-1 MOF | 298 | 8.01 | 5.34 | 66.7 | 4.9 | 21.0 |
| MIL-101c MOF | 303 | 6.70 | 3.20 | 47.8 | 5.0 | 9.5 |
| MOF1[a] | 298 | 0.94 | 0.66 | 70.6 | 3.3 | 8.3 |
| Zeolite-13X | 298 | 5.37 | 1.40 | 26.1 | 4.2 | 2.0 |
| POP1[b] | 298 | 2.93 | 1.44 | 49.2 | 3.6 | 11.5 |

[a][Zn₃(OH)(p-cdc)₂.₅(DMF)₄] where p-CDC is deprotonated form of 1,12-dihydroxydicarbonyl-1,12-dicarba-closo-dode-caborane
[b]35% Li-reduced diimide-POP LFG Separation Using VSA Typical operating conditions for this process are as follows:

CO₂/CH₄ composition: 50/50
$P_{ads}/P_{des}$: 1 atm/0.1 atm
T: RT

Table 3.11 displays the calculated values of the selection parameters for Zn(NH₃)(CO₃) and other prominent adsorbents. Regardless of q and Δq, Zn(NH₃)(CO₃) provides higher R, $\alpha_{qij}$, and S values than other known candidates. The superior performance of Zn(NH₃)(CO₃) for this process originates from the fact that CH₄ adsorption at the conditions of this process can practically be considered as zero. Therefore, Zn(NH₃)(CO₃) can be an appropriate adsorbent for LFG separation by VSA.

TABLE 0.8

Performance of Zn(NH₃)(CO₃) and other selected adsorbents in VSA-based LFG separation.
The highest value of each parameter is bolded.

| Adsorbent | T (K) | q (mmole/g) | Δq (mmole/g) | R (%) | $\alpha_{qij}$ | S |
|---|---|---|---|---|---|---|
| Zn(NH₃)(CO₃) | 293 | 0.027 | 0.024 | 90.5 | 42.8 | 272.7 |
| HKUST-1 MOF | 298 | 2.81 | 1.90 | 67.5 | 5.5 | 19.8 |
| MIL-101c MOF | 303 | 6.70 | 3.20 | 47.8 | 5.0 | 9.5 |
| Mg-MOF-74 | 298 | 7.23 | 2.32 | 32.1 | 12.5 | 23.5 |
| ZIF-82 | 298 | 1.42 | 1.20 | 84.9 | 5.6 | 20.5 |
| Zeolite-13X | 298 | 3.97 | 1.97 | 49.6 | 13.2 | 19.1 |

Post-Combustion Flue Gas Separation Using VSA

Typical operating conditions for this process are as follows:

CO₂/N₂ composition: 10/90
$P_{ads}/P_{des}$: 1 atm/0.1 atm
T: RT

Regarding the low partial pressure of CO₂, the CO₂ uptake is not considerable under the conditions of this process. In addition, adsorbents like zeolite 13-x, Co-carborane MOF-4b, and ZIF-78 show higher R, $\alpha_{qij}$, and S values than Zn(NH₃)(CO₃). Therefore, Zn(NH₃)(CO₃) is not a good candidate for VSA-based post-combustion flue gas separation.

Pre-Combustion Hydrogen Separation Using PSA

Typical operational conditions for this process are as follows:

CO₂/H₂ composition: 40/60
$P_{ads}/P_{des}$: 5 atm/1 atm
T: RT

Table 3.12 shows the calculated values of the selection parameters for Zn(NH₃)(CO₃) and other prominent adsorbents. Zn(NH₃)(CO₃) exhibits the highest R, which is result of the type of isotherm. However, since the partial pressure of the CO₂ in the mixture is low, q and Δq of the adsorbent are lower than other adsorbents. Moreover, other adsorbents are better candidates with respect to the working selectivity and S. All in all, Zn(NH₃)(CO₃) is not a good candidate for PSA-based natural gas purification.

TABLE 0.9

Performance of Zn(NH₃)(CO₃) and other selected adsorbents in PSA-based precombustion hydrogen separation.
The highest value of each parameter is bolded

| Adsorbent | T (K) | q (mmole/g) | Δq (mmole/g) | R (%) | $\alpha_{qij}$ | S |
|---|---|---|---|---|---|---|
| Zn(NH₃)(CO₃) | 293 | 0.122 | 0.101 | 82.5 | 7.3 | 10.9 |
| Carbon active | 303 | 3.33 | 1.88 | 56.5 | 58.7 | 639.6 |
| Zeolite NaX | 303 | 5.02 | 1.22 | 24.4 | 4.04 | 2.6 |
| Zeolite | 303 | 3.93 | 1.96 | 49.8 | 98.3 | 1960.3 |

Oxy-Fuel CO₂ Purification Using PSA

Typical operating conditions for this process are as follows:

CO₂/O₂ composition: 90/10
$P_{ads}/P_{des}$: 5 atm/1 atm
T: RT

Table 3.13 tabulates the calculated values of the selection parameters for Zn(NH₃)(CO₃) and other prominent adsorbents. Regardless of q and Δq, Zn(NH₃)(CO₃) provides higher R, $\alpha_{qij}$, and S values than other known candidates.

The superior performance of the adsorbent for this process originates from the high partial pressure of $CO_2$ and low $O_2$ uptake at RT. Therefore, $Zn(NH_3)(CO_3)$ can be an appropriate adsorbent for Oxy-fuel $CO_2$ Purification by PSA.

TABLE 0.10

Performance of $Zn(NH_3)(CO_3)$ and other selected adsorbents in PSA-based oxy-fuel $CO_2$ purification.
The highest value of each parameter is bolded.

| Adsorbent | T (K) | q (mmole/g) | Δq (mmole/g) | R (%) | $\alpha_{qij}$ | S |
|---|---|---|---|---|---|---|
| $Zn(NH_3)(CO_3)$ | 293 | 0.338 | 0.288 | 85.1 | 17.3 | 844.8 |
| Cu-BTC MOF | 298 | 10.207 | 5.760 | 56.4 | 4.1 | 6.6 |
| Zeolite NaX | 303 | 5.548 | 1.281 | 23.1 | 9.4 | 85.5 |

Regarding the ultramicroporous structure, $Zn(NH_3)(CO_3)$ does not exhibit large gas uptake compared to other adsorbents. However, this deficiency is offset by considerable selectivity, regenerability, and adsorbent selection parameter—especially for processes in which partial pressure of $CO_2$ and/or adsorption pressure is large. The origin of this behavior is the Type II isotherm of $CO_2$ adsorption and the Type II isotherm of adsorption of other gases at room temperature. Since all selection criteria are considered for industrial adsorbent selection, $Zn(NH_3)(CO_3)$ is capable of being adopted for processes such as LFG and $CO_2/O_2$ separations. It should be noted that chemical, structural, and thermal stabilities were not assessed for all the candidate adsorbents referenced in Tables 3.9 to 3.13. If these conditions were considered in the selection criteria, some adsorbents would be recognized as unsuitable for industrial use. For instance, MOF-74's superior $CO_2$ capacity is due to the exposed cations, which make MOF-74 water- and air-sensitive and thus inapplicable for LFG (see Table 3.11) and flue gas separation.

$N_2$ and $O_2$ needed in industries are acquired from air by air separation processes, and the most common air separation process utilized in industry is cryogenic distillation. Since the critical temperature and pressure of air are −140.7° C. (132.5 K) and 37.7 bar, respectively, air separation should be performed at temperatures below −140.7° C. (132.5 K). For instance, to separate air at atmospheric pressure, the temperature must be decreased to −192° C. (81.5 K) to have vapor-liquid equilibrium. To increase this temperature to −172° C. (101 K), air should be compressed to 6 bar. Therefore, air separation by this process is extremely energy-intensive. On the other hand, air separation by the adsorption process is limited to small-scale separation by zeolites under the kinetic mechanism. The $O_2$ and $N_2$ separated by this process are not pure and usually are used in hospitals. As Table 3.5 implies, $Zn(NH_3)(CO_3)$ shows considerable selectivity to separate $O_2$ from $N_2$ at 263 K ($\alpha_{Hij}$=76.5). Although this temperature is still sub-atmospheric, it is much higher than temperatures at which cryogenic distillation is operated. Therefore, adsorption-based air separation by $Zn(NH_3)(CO_3)$ can be proposed, for which the operating conditions are as follows:

$O_2/N_2$ composition: 20/80
$P_{ads}/P_{des}$: 5 atm/1 atm
T: 263 K

Table 1.4 tabulates the calculated values of the selection parameters for $Zn(NH_3)(CO_3)$. Based upon these selection criteria, it can be expected that air separation by this process is less energy-intensive than cryogenic distillation. To validate the proposed process, energy assessment analysis is required to measure the energy penalty associated with this process and compare it with that of cryogenic distillation. Such analysis was out of scope of this study.

TABLE 0.11

Performance of $Zn(NH_3)(CO_3)$ in a PSA based air separation.

| q (mmole/g) | Δq (mmole/g) | R (%) | $\alpha_{qij}$ | S |
|---|---|---|---|---|
| 0.150 | 0.121 | 80.8 | 19.2 | 49.5 |

The preceding examples can be repeated with similar success by substituting the generically or specifically described reactants and/or parameters of this invention for those used in the preceding examples.

Note that in the specification and claims, "about" or "approximately" means within twenty percent (20%) of the numerical amount cited. Although the invention has been described in detail with particular reference to these embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method for capturing $CO_2$ in a fixed bed column comprising:
    adsorbing $CO_2$ from a gas mixture stream in a column comprising $Zn(NH_3)(CO_3)$ sorbent at room temperature and at an adsorption pressure $P_{ads}$; and
    regenerating the column adsorbing the $CO_2$, after its saturation breakthrough, by desorption at room temperature and at a desorption pressure $P_{des}$, wherein $P_{des}$ is less than $P_{ads}$.

2. The method of claim 1 wherein the gas mixture is a $CO_2/O_2$ mixture.

3. The method of claim 2 wherein the capture is for an oxy-fuel $CO_2$ process by pressure swing adsorption.

4. The method of claim 3 wherein the $P_{ads}/P_{des}$ is about 5 atm/1 atm.

5. The method of claim 1 wherein the gas mixture is $CO_2/CH_4$.

6. The method of claim 5 wherein the capture is for a landfill gas process under pressure swing adsorption.

7. The method of claim 5 wherein the $P_{ads}/P_{des}$ is about 5 atm/1 atm.

8. The method of claim 5 wherein the capture is for a landfill gas process under pressure swing adsorption.

9. The method of claim 8 wherein the $P_{ads}/P_{des}$ is about 1 atm/vacuum pressure of 0.1 atm.

* * * * *